United States Patent
Luo et al.

(10) Patent No.: US 12,267,162 B2
(45) Date of Patent: Apr. 1, 2025

(54) METHOD FOR POLAR CODING AND APPARATUS

(71) Applicant: HUAWEI TECHNOLOGIES CO., LTD., Guangdong (CN)

(72) Inventors: Hejia Luo, Hangzhou (CN); Yinggang Du, Shenzhen (CN); Rong Li, Boulogne Billancourt (FR); Lingchen Huang, Hangzhou (CN); Ying Chen, Hangzhou (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 18/512,912

(22) Filed: Nov. 17, 2023

(65) Prior Publication Data
US 2024/0171307 A1 May 23, 2024

Related U.S. Application Data

(63) Continuation of application No. 17/716,402, filed on Apr. 8, 2022, now Pat. No. 11,843,461, which is a
(Continued)

(30) Foreign Application Priority Data

Sep. 18, 2017 (CN) .......................... 201710843554.1
Nov. 17, 2017 (CN) .......................... 201711148239.3

(51) Int. Cl.
*H04L 1/00* (2006.01)
(52) U.S. Cl.
CPC .......... *H04L 1/0057* (2013.01); *H04L 1/0071* (2013.01)
(58) Field of Classification Search
CPC .... H03M 13/09; H03M 13/13; H03M 13/096; H03M 13/15; H03M 13/1105;
(Continued)

(56) References Cited

U.S. PATENT DOCUMENTS 11,394,489 B2 * 7/2022 Wesslén et al. ...... H04L 1/0071
2006/0142913 A1 6/2006 Coffee et al.
(Continued)

FOREIGN PATENT DOCUMENTS

CA 2971769 6/2016
CA 2971769 A1 * 6/2016 ............ H03M 13/13
(Continued)

OTHER PUBLICATIONS

3GPP TS 38.211 V1.0.0 (Sep. 2017), "3rd Generation Partnership Project; Technical Specification Group Radio Access Network; NR; Physical channels and modulation (Release 15)," Sep. 2017, 37 pages.
(Continued)

*Primary Examiner* — Shelly A Chase
(74) *Attorney, Agent, or Firm* — Fish & Richardson P.C.

(57) ABSTRACT

Embodiments of this application provide a method for coding in a wireless communication network. A communication device interleave a first bit sequence to obtain a first interleaved sequence having sequence number starting with a sequence number of 0, wherein the first bit sequence comprises bits for indicating timing, wherein the bits for indicating timing comprises a set of bits for indicating synchronization signal block index (SSBI); wherein the set of bits for indicating SSBI are placed in positions indicated by sequence numbers of 2, 3 and 5 in the first interleaved sequence. The devices add d first CRC bits on the first interleaved sequence to obtain a second bit sequence, interleave on the second bit sequence according to an interleave pattern to obtain a second interleaved sequence, and polar encode the second interleaved sequence to obtain the encoded sequence.

17 Claims, 7 Drawing Sheets

Related U.S. Application Data continuation of application No. 16/908,252, filed on Jun. 22, 2020, now Pat. No. 11,303,388, which is a continuation of application No. 16/506,765, filed on Jul. 9, 2019, now Pat. No. 10,693,590, which is a continuation of application No. PCT/CN2018/106288, filed on Sep. 18, 2018.

(58) Field of Classification Search
CPC ... H04L 1/0042; H04L 1/0057; H04L 1/0058; H04L 1/0061; H04L 1/0071
See application file for complete search history.

(56) References Cited

U.S. PATENT DOCUMENTS

| | | | |
|---|---|---|---|
| 2008/0056393 | A1 | 3/2008 | Niu et al. |
| 2009/0196421 | A1 | 8/2009 | Okuda |
| 2011/0243066 | A1 | 10/2011 | Nayeb Nazar et al. |
| 2017/0288703 | A1 | 10/2017 | Shen et al. |
| 2018/0198555 | A1 | 7/2018 | Wu et al. |
| 2018/0332479 | A1 | 11/2018 | Chai et al. |
| 2018/0358985 | A1 | 12/2018 | Kim et al. |
| 2018/0375612 | A1 | 12/2018 | Sarkis et al. |
| 2019/0268025 | A1 | 8/2019 | Shen et al. |
| 2020/0228236 | A1* | 7/2020 | Xi .................. H04L 1/0057 |
| 2020/0374038 | A1 | 11/2020 | Wang et al. |

FOREIGN PATENT DOCUMENTS

| | | |
|---|---|---|
| CN | 102122966 | 7/2011 |
| CN | 104219019 | 12/2014 |
| KR | 20170097190 | 8/2017 |
| RU | 2565016 | 10/2015 |
| WO | 2016101089 | 6/2016 |
| WO | 2017124941 | 7/2017 |
| WO | 2018231924 | 12/2018 |

OTHER PUBLICATIONS

3GPP TS 38.212 V1.0.0 (Sep. 2017), "3rd Generation Partnership Project, Technical Specification Group Radio Access Network," Sep. 2017, 28 pages.

3GPP TS 38.213 V1.0.0 (Sep. 2017), "3rd Generation Partnership Project; Technical Specification Group Radio Access Network; NR; Physical layer procedures for control (Release 15)," Sep. 2017, 16 pages.

3GPP TS 38.321 V1.0.0 (Sep. 2017), "3rd Generation Partnership Project; Technical Specification Group Radio Access Network; NR; Medium Access Control (MAC) protocol specification (Release 15)," Sep. 2017, 46 pages.

Ericsson, "Polar Code Design for NA-PBCH," 3GPP TSG RAN WG1 Meeting#90bis, R1-1717998, Prague, CZ, Oct. 9-13, 2017, 12 pages.

Ericsson, "Polar Code Design for NR-PBCH," 3GPP TSG-RAN WG1 Meeting NR#3, R1-1715741, Nagoya, Japan, Sep. 18-21, 2017, 10 pages.

Extended European Search Report issued in European Application No. 18856598.0 on Jul. 24, 2020, 6 pages.

Huawei, "Order of PBCH Fields," 3GPP TSG-RAN WG1 Meeting #91, R1-1720758, Reno, USA, Nov. 27-Dec. 1, 2017, 8 pages.

Huawei, "Summary of [89-27] Polar Code Proposal for NR," 3GPP TSG-RAN WG1 NR Ad-Hoc#2, R1-1711442, Qingdao, China, Jun. 27-30, 2017, 41 pages.

Marshall-Comm. Tech. Blog [online], "5G-NR multiplexing and channel coding v1.0.0," published on Sep. 10, 2017, retrieved from: URL <https://marshallcomm.cn/2017/09/10/nr-v100-11-multiplexing-coding/>, 13 pages.

Mediatek et al., "Way Forward on PBCH Bit Mapping Design" 3 GPP TSG-RAN WG1 Meeting #91, R1-1721503, Reno, USA, Nov. 28-Dec. 1, 2017, 3 pages.

MediaTek Inc., "Optimization and Comparison of Polar Code Rate-Matching Design" 3GPP TSG-RAN WG1 Ran1 Ad-Hoc #2, R1-1710825, Qingdao, China, Jun. 27-30, 2017, 7 pages.

MediaTek Inc., "PBCH Enhancement with Polar Code", 3GPP TSG-RAN WG1Ah NR Meeting, R1-1700169, Spokane, USA, Jan. 16-20, 2017, 5 pages.

Nokia et al., "Polar Design for Control Channels", 3GPP TSG-RAN WG1 Meeting #88, R1-1703106, Athens, Greece, Feb. 13-17, 2017, 9 pages.

Office Action in Japanese Appln. No. 2021-190679, dated Dec. 6, 2022, 10 pages (with English translation).

Office Action issued in Chinese Application No. 201910214167.0 on Feb. 3, 2020, 3 pages.

Office Action issued in Chinese Application No. 201910214167.0 on Oct. 14, 2019, 8 pages.

Office Action issued in Japanese Application No. 2020-515937 on Jul. 6, 2021, 19 pages (with English translation).

Office Action issued in Russian Application No. 2020113530/07(022897) on Jan. 24, 2022, 6 pages (with English translation).

PCT International Search Report and Written Opinion in International Application No. PCT/CN2018/106288, Mar. 12, 2018, 15 pages (With Partial English Translation).

Qualcomm Incorporated, "PBCH Design Using Polar Codes," 3GPP TSG-Ran WG1 NR-Adhoc #3, R1-1716448, Nagoya, Japan, Sep. 18-21, 2017, 8 pages.

Ricciutelli et al., "On the Error Probability of Short Concatenated Polar and Cyclic Codes with Interleaving," 2017 IEEE International Symposium on Information Theory (ISIT), Jun. 30, 2017, 5 pages.

Search Report issued in Chinese Application No. 201910214167.0 on Jan. 19, 2020, 2 pages.

Zhou et al., Segmented CRC-Aided SC List Polar decoding, IEEE, pp. 1 to 5. (Year: 2016).

\* cited by examiner

| PBCH information content | Corresponding bit sequence numbers | Quantity of bits | Reliability priority, where a lower-priority bit is placed at a lower-reliability position | Sequence numbers of to-be-mapped polar subchannels |
|---|---|---|---|---|
| Bandwidth information | $a_0$ to $a_4$ | 5 | 1 | 483 415 485 473 474 |
| Universal control channel configuration information | $a_5$ to $a_9$ | 5 | 2 | 254 379 431 489 486 |
| Time sequence information (SFN) | $a_{10}$ to $a_{16}$ | 7 | 3 | 476 439 490 463 381 497 492 |
| Time sequence information (SSBI) | $a_{17}$ to $a_{19}$ | 3 | 4 | 443 382 498 |
| SIB | $a_{20}$ to $a_{23}$ | 4 | 5 | 445 471 500 446 475 |
| Reserved bits | $a_{24}$ to $a_{27}$ | 24 | 0 | 484 430 488 239 378 459 437 380 461 496 351 467 438 251 462 442 441 469 247 367 253 375 444 470 |
| CRC | $a_{48}$ to $a_{71}$ | 24 | 6 | 475 487 504 255 477 491 478 383 493 499 502 494 501 447 505 506 479 508 495 503 507 509 510 511 |

FIG. 2

| PBCH information content | Corresponding bit sequence numbers | Quantity of bits | Reliability priority, where a lower-priority bit is placed at a lower-reliability position | Sequence numbers of to-be-mapped polar subchannels |
|---|---|---|---|---|
| Bandwidth information | $a_0$ to $a_4$ | 5 | 1 | 415 485 473 474 254 |
| Universal control channel configuration information | $a_5$ to $a_9$ | 5 | 2 | 379 431 486 476 439 |
| Time sequence information (SFN) | $a_{10}$ to $a_{16}$ | 7 | 3 | 490 463 381 382 445 471 446 |
| Time sequence information (SSBI) | $a_{17}$ to $a_{19}$ | 3 | 4 | 475 487 255 |
| SIB indication | $a_{20}$ to $a_{23}$ | 4 | 5 | 477 383 447 479 |
| Reserved bits | $a_{24}$ to $a_{27}$ | 24 | 0 | 484, 430, 488, 239, 378, 459, 437, 380, 461, 351, 467, 438, 251, 462, 442, 441, 469, 247, 367, 253, 375, 444, 470, 483, 415, 485, 473, 474, 254, 379, 431, 486, 476, 439, 490, 463, 381, 382, 445, 471, 446, 475, 487, 255, 477, 383, 447, 479 |
| CRC | $a_{48}$ to $a_{71}$ | 24 | NA | 443, 478, 489, 491, 492, 493, 494, 495, 496, 497, 498, 499, 500, 501, 502, 503, 504, 505, 506, 507, 508, 509, 510, 511 |

FIG. 3

METHOD FOR POLAR CODING AND APPARATUS

CROSS-REFERENCE TO RELATED APPLICATIONS

This application is a continuation of U.S. patent application Ser. No. 17/716,402, filed on Apr. 8, 2022, which is a continuation of U.S. patent application Ser. No. 16/908,252, filed on Jun. 22, 2020, now U.S. Pat. No. 11,303,388, which is a continuation of U.S. patent application Ser. No. 16/506,765, filed on Jul. 9, 2019, now U.S. Pat. No. 10,693,590, which is a continuation of International Application No. PCT/CN2018/106288, filed on Sep. 18, 2018. The International Application claims priority to Chinese Patent Application No. 201711148239.3, filed on Nov. 17, 2017 and Chinese Patent Application No. 201710843554.1, filed on Sep. 18, 2017. All of the afore-mentioned patent applications are hereby incorporated by reference in their entireties.

TECHNICAL FIELD

Embodiments of the present invention relate to the encoding and decoding field, and more specifically, to a method for polar coding and an apparatus.

BACKGROUND

In a communications system, channel coding is generally used to improve reliability of data transmission to ensure communication quality. A polar code is an encoding manner that can achieve a Shannon capacity, with low coding and decoding complexity. The polar code is a linear block code including information bit(s) and frozen bit(s). A matrix for generating a polar code is $G_N$, and a process of encoding a polar code is $x_1^N = u_1^N G_N$. Herein, $u_1^N = \{u_1, u_2, \ldots, u_N\}$ is a binary row vector whose length is N.

However, when channel coding is performed on a physical broadcast channel (Physical Broadcast Channel, PBCH) by using a polar code, there is still space for further improving transmission reliability of the broadcast channel.

SUMMARY

This application provides a polar encoding method, including:
determining that a payload of broadcast signaling includes D cyclic redundancy check CRC bits and M predictable information bits;
mapping the M predictable information bits to M low-reliability information bits in K information bits of a polar code respectively, and mapping the D cyclic redundancy check CRC bits to D high-reliability information bits in remaining information bits of the K information bits, to obtain mapped bits, where M<K, and D, M, and K are all positive integers;
performing polar encoding on the mapped bits, to obtain encoded encoding bits; and
sending the encoding bits.

This application provides a polar encoding method, including:
a polar encoding apparatus, including:
a processor, configured to: determine that a payload of broadcast signaling includes D cyclic redundancy check CRC bits and M predictable information bits; map the M predictable information bits to M low-reliability information bits in K information bits of a polar code respectively, and map the D cyclic redundancy check CRC bits to D high-reliability information bits in remaining information bits of the K information bits, to obtain mapped bits, where M<K, and D, M, and K are all positive integers; and
perform polar encoding on the mapped bits, to obtain encoded encoding bits.

BRIEF DESCRIPTION OF DRAWINGS

To describe technical solutions in embodiments of the present invention more clearly, the following briefly describes the accompanying drawings required for describing the embodiments of the present invention. Apparently, the accompanying drawings in the following description show merely some embodiments of the present invention, and a person of ordinary skill in the art may still derive other drawings from these accompanying drawings without creative efforts.

FIG. 2 is a schematic block diagram of a polar encoding method according to an embodiment of the present invention;

FIG. 3 is a schematic block diagram of another polar encoding method according to an embodiment of the present invention;

DESCRIPTION OF EMBODIMENTS

Figure 1:
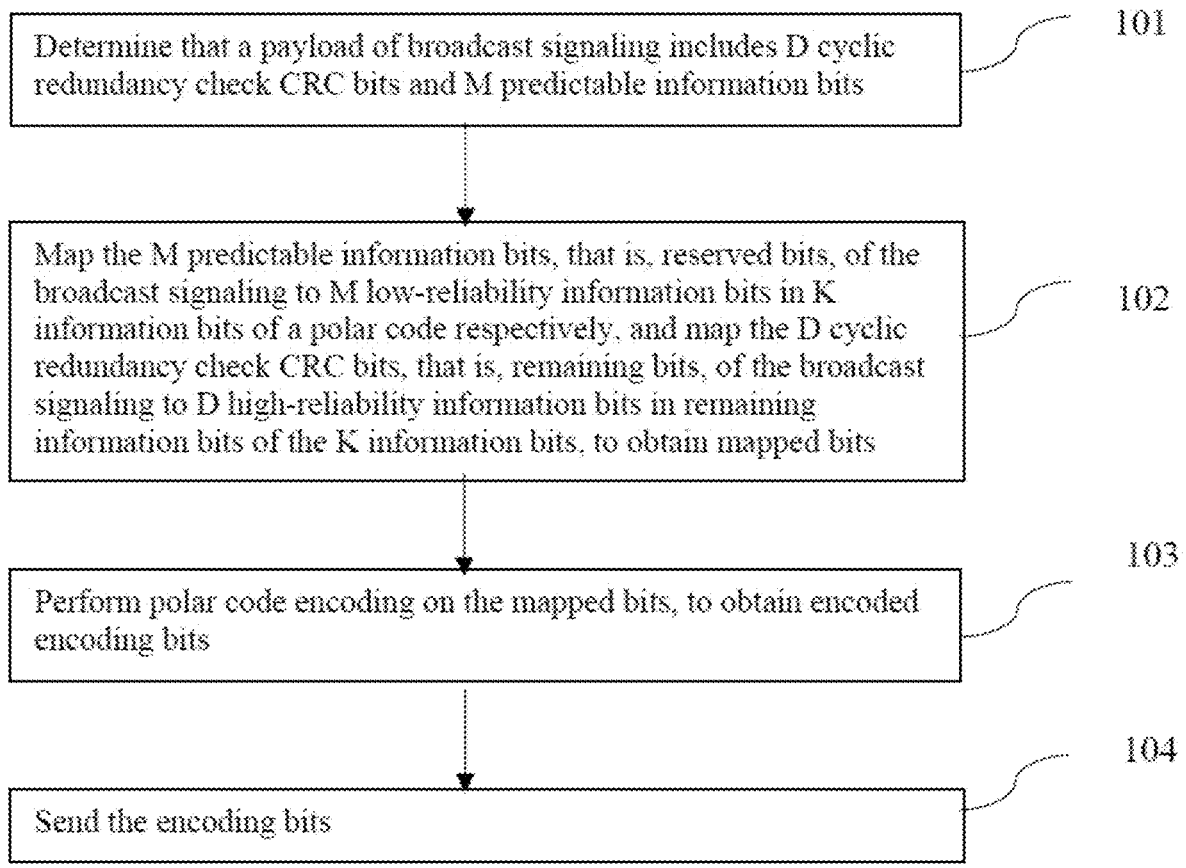
FIG. 1 is a schematic flowchart of a polar encoding method according to an embodiment of the present invention.

The following clearly describes the technical solutions in the embodiments of the present invention with reference to the accompanying drawings in the embodiments of the present invention. Apparently, the described embodiments are a part rather than all of the embodiments of the present invention.

Terminologies such as "component", "module", and "system" used in this specification are used to indicate computer-related entities, hardware, firmware, combinations of hardware and software, software, or software being executed. For example, a component may be, but is not limited to, a process that runs on a processor, a processor, an object, an executable file, an executable thread, a program, and/or a computer. Both a computing device and an application that runs on a computing device may be components. One or more components may reside within a process and/or an executable thread, and a component may be located on one computer and/or distributed between two or more computers. In addition, these components may be executed from various computer-readable media that store various data structures. For example, the components may communicate by using a local and/or remote process and based on, for example, a signal having one or more data packets (for example, data from two components interacting with another component in a local system, in a distributed system, and/or across a network such as the Internet interacting with other systems by using the signal).

In addition, the embodiments are described with reference to an access terminal. The access terminal may also be referred to as a system, a subscriber unit, a subscriber station, a mobile station, a mobile station, a remote station, a remote terminal, a mobile device, a user terminal, a terminal, a wireless communications device, a user agent, a user apparatus, or UE (user equipment). The access terminal may be a cellular phone, a cordless phone, a SIP (Session Initiation Protocol) phone, a WLL (wireless local loop) station, a PDA (personal digital assistant), a handheld device having a wireless communication function, a computing device, or another processing device connected to a wireless modem. In addition, the embodiments are described with reference to a base station. The base station may be configured to communicate with a mobile device. The base station may be a BTS (base transceiver station) in a GSM (Global System for Mobile communications, Global System for Mobile Communications) or in CDMA (Code Division Multiple Access, Code Division Multiple Access), or may be an NB (NodeB, node B) in WCDMA (Wideband Code Division Multiple Access, Wideband Code Division Multiple Access), or may be an eNB or an eNodeB (evolved NodeB) in LTE (Long Term Evolution, Long Term Evolution), a relay station or an access point, a base station device in a 5G network, or the like.

In addition, each aspect or feature of the present invention may be implemented as a method, an apparatus, or a product that uses standard programming and/or engineering technologies. The term "product" used in this application covers a computer program that can be accessed from any computer readable device, carrier, or medium. For example, a computer readable medium may include, but is not limited to: a magnetic storage device (for example, a hard disk, a floppy disk, or a magnetic tape), an optical disc (for example, a CD (compact disc), or a DVD (digital versatile disc)), a smart card, and a flash memory device (for example, an EPROM (Erasable Programmable Read-Only Memory, erasable programmable read-only memory), a card, a stick, or a key driver). In addition, various storage media described in this specification may indicate one or more devices and/or other machine-readable media that are used to store information. The term "machine readable media" may include but is not limited to a radio channel, and various other media that can store, contain and/or carry an instruction and/or data.

A wireless communications system according to the embodiments described in this specification. The system includes a base station . The base station may include a plurality of antenna sets. For example, one antenna set may include antennas and, another antenna set may include antennas and, and an additional set may include antennas. Two antennas are shown for each antenna set. However, more or fewer antennas may be used in each set. The base station may additionally include a transmitter chain and a receiver chain. A person of ordinary skill in the art may understand that both the transmitter chain and the receiver chain may include a plurality of components (for example, a processor, a modulator, a multiplexer, a demodulator, a demultiplexer, or an antenna) related to signal sending and reception.

The base station may communicate with one or more access terminals (for example, an access terminal and an access terminal). However, it may be understood that the base station may communicate with almost any quantity of access terminals that are similar to the access terminals . The access terminals may be, for example, cellular phones, smartphones, portable computers, handheld communications devices, handheld computing devices, satellite radio apparatuses, global positioning systems, PDAs, and/or any other appropriate devices configured to communicate in the wireless communications system.

Within a given time, the base station, the access terminal may be a wireless communications sending apparatus and/or a wireless communications receiving apparatus. When sending data, the wireless communications sending apparatus may encode the data for transmission. Specifically, the wireless communications sending apparatus may have (for example, generate, obtain, or store in a memory) a particular quantity of information bits that need to be sent to the wireless communications receiving apparatus by using a channel. Such information bits may be included in a transport block (or a plurality of transport blocks) of the data. The transport block may be segmented to generate a plurality of code blocks. In addition, the wireless communications sending apparatus may use a polar code encoder (not shown) to encode each code block, so as to improve reliability of data transmission and further ensure communication quality.

A system, to which a polar encoding method according to the present invention is applicable, in a wireless communications environment. The system includes a wireless communications device. The wireless communications device is shown to send data by using a channel. Although the data sending is shown, the wireless communications device may further receive data (for example, the wireless communications device may send and receive data at the same time, the wireless communications device may send and receive data at different moments, or a combination of the two cases may be used, or the like) by using a channel. The wireless communications device may be, for example, a base station (for example, the base station discussed above), an access terminal, or the like.

The wireless communications device may include a polar code encoder, a rate matching apparatus, and a transmitter. Optionally, when the wireless communications device receives data by using a channel, the wireless communications device may further include a receiver. The receiver may exist separately, or may be integrated with the transmitter to form a transceiver.

The polar code encoder is configured to encode data that needs to be transmitted from the wireless communications apparatus, to obtain an encoded polar code.

In this embodiment of the present invention, the polar encoder is configured to: determine that a payload of broadcast signaling includes D cyclic redundancy check CRC bits and M predictable information bits; map the M predictable information bits to M low-reliability information bits in K information bits of the polar code respectively, and map the D cyclic redundancy check CRC bits to D high-reliability information bits in remaining information bits of the K information bits, to obtain mapped bits, where M<K, and D. M, and K are all positive integers; and perform polar encoding on the mapped bits, to obtain encoded encoding bits.

In addition, the transmitter may subsequently transmit, on a channel, an output bit that has been processed by the rate matching apparatus and that has undergone rate matching. For example, the transmitter may send related data to another different wireless communications apparatus (not shown).

A specific process in which the foregoing polar code encoder performs processing is described below in detail. It should be noted that these examples are only intended to help a person skilled in the art to better understand the embodiments of the present invention rather than limiting the scope of the embodiments of the present invention.

FIG. 1 is a schematic flowchart of a polar encoding method according to an embodiment of the present invention. The method shown in FIG. 1 may be performed by a wireless communications device, for example, the polar encoder in the wireless communications device discussed above. The encoding method in FIG. 1 includes the following steps.

101. Determine that a payload of broadcast signaling includes D cyclic redundancy check CRC bits and M predictable information bits, where M<K, and M and K are both positive integers.

It should be understood that the broadcast signaling is signaling carried on a broadcast channel such as a physical broadcast channel PBCH. The following describes the encoding method in detail by using a PBCH as an example. However, the present invention is not limited to the PBCH.

A payload of the PBCH includes D cyclic redundancy check CRC bits and M predictable information bits.

It should be understood that the payload of the PBCH is classified into the following four types depending on whether content of an access service is variable.

A first type of bits includes reserved bits, or similar information bits whose values are completely constant, or bits whose values are directly determined according to a protocol.

A second type of bits includes information bits whose values keep unchanged, namely, information bits that keep unchanged in a master information block (Master Information Block, MIB); or may alternatively be understood as information bits whose values in the MIB cannot be directly determined according to a protocol but need to be detected during network access and keep unchanged. For example, the second type of bits may include one or more of system bandwidth related information, subcarrier information, indication information of system configuration numerology supported by a base station BS, universal control channel information, and the like.

A third type of bits includes predictable information bits in which content of time sequence information varies, namely, a predictable MIB information part in which content of time sequence information varies.

It should be understood that an application scenario of the third type of bits does not occur in an initial access phase.

For example, the third type of bits includes one or more of a system frame number (SFN), a sequence number of a synchronization signal, SS SS block, a half frame indicator (HFI), and the like.

A fourth type of bits includes unpredictable information bits, namely, an unpredictable MIB information part in which information may vary at any time. For example, for control channel configuration information of a current frame, the configuration may appear repeatedly but may vary at any time.

Different from the third type of bits, the fourth type of bits needs to be correspondingly detected each time.

For example, the fourth type of bits includes indication information of a current system configuration parameter numerology and SIB resource indication information.

If there is a fourth type of MIB information, corresponding CRC bits also belong to the fourth type of bits.

It should be understood that if a MIB does not include the fourth type of bits, the CRC bits may be classified as the third type of bits; or if a MIB does not include the fourth type of bits, the CRC bits are classified as the fourth type of bits; or if a MIB includes both the third type of bits and the fourth type of bits, the CRC bits are classified as the fourth type of bits. Herein, when CRC is classified, the following is mainly considered: if there is a set of third-type bits, values of the CRC bits depend on the third type of bits in MIB information; or if there is the fourth type of bits, values of the CRC bit depend on the fourth type of bits in the MIB information. Therefore, the foregoing classification is performed for the CRC bits.

Based on the foregoing classification, the payload of the PBCH is classified into the foregoing four types of bit sets. It may be understood that the payload of the PBCH may include one or more of the foregoing four types of bit sets.

Depending on whether a predictable information bit is predictable, first-type bits to third-type bits may further be classified as predictable information bits while fourth-type bits may be classified as unpredictable information bits. The M predictable information bits include one or more of the following bit combinations: $M_1$ first-type bits, $M_2$ second-type bits, or $M_3$ third-type bits. The first-type bit is a reserved bit. The second-type bit includes an information bit whose value keeps unchanged. The third-type bit is a predictable information bit whose value is content of time sequence information and varies. $M_1$, $M_2$, and $M_3$ are all positive integers, $M_1<=M$, $M_2<=M$, and $M_3<=M$.

102. Map the M predictable information bits to M low-reliability information bits in K information bits of a polar code respectively, and map the D cyclic redundancy check CRC bits to D high-reliability information bits in remaining information bits of the K information bits, to obtain mapped bits, where M<K, and D, M, and K are all positive integers.

On the whole, based on the foregoing classification of bit sets and an order from the first type to the fourth type, content of the payload of the PBCH is mapped to an information bit set of the polar code in ascending order of reliability of subchannels in the information bit set. A specific mapping manner varies according to different classified types.

When content of a same type is mapped to subchannels in the information bit set of the polar code, an order of different bits of the same type may be interchanged. For example, the $M_3$ third-type bits include $M_1$ information bits of a system frame number and $M_2$ information bits of a sequence number of a synchronization block SS block. When the bits of the system frame number and the bits of the sequence number of the synchronization block SS block in the third-type bits are mapped to subchannels in the information bit set of the polar code, the $M_1$ bits of the system frame number are mapped to $M_1$ information bits in M low-reliability information bits, and the $M_2$ information bits of the sequence number of the SS block are mapped to $M_2$ low-reliability information bits in remaining information bits of the M low-reliability information bits; or, the $M_2$ information bits of the sequence number of the SS block are mapped to $M_2$ information bits in M low-reliability information bits, and the $M_1$ bits of the system frame number are mapped to $M_1$ low-reliability information bits in remaining information bits of the M low-reliability information.

The SS block carries a primary synchronization sequence and a secondary synchronization sequence.

The broadcast signaling usually includes several reserved bits that actually do not carry useful information. In this way, during polar encoding, bits are classified, and classified types of bits are mapped to low-reliability information bits according to a rule. Even if the reserved bits are changed during transmission, correct decoding of the broadcast signaling is not affected.

It should also be understood that a measurement form of reliability is not limited in this embodiment of the present invention. For example, reference may be made to an existing polar code reliability metric, such as a bit capacity, a Bhattacharyya distance Bhattacharyya parameter, or an error probability.

Optionally, the M predictable information bits include one or more of the following bit combinations: $M_1$ first-type bits, $M_2$ second-type bits, or $M_3$ third-type bits. The first-type bit is a reserved bit. The second-type bit includes an information bit whose value keeps unchanged. The third-type bit is a predictable information bit whose value is content of time sequence information and varies. $M_1$, $M_2$, and $M_3$ are all positive integers, $M_1<=M$, $M_2<=M$, and $M_3<=M$.

Further, optionally, when the M predictable information bits include the $M_1$ first-type bits and the $M_2$ second-type bits or include the $M_1$ reserved bits and the $M_3$ second-type bits, the $M_1$ first-type bits are mapped to $M_1$ low-reliability information bits in M information bits, and the $M_2$ second-type bits are mapped to $M_2$ low-reliability information bits in remaining information bits of the M information bits; or the $M_1$ first-type bits are mapped to $M_1$ low-reliability information bits in M information bits, and the $M_3$ second-type bits are mapped to $M_3$ low-reliability information bits in remaining information bits of the M information bits.

Optionally, when the M predictable information bits include the $M_1$ first-type bits, the $M_2$ second-type bits, and the $M_3$ second-type bits, the $M_1$ first-type bits are mapped to $M_1$ low-reliability information bits in M information bits;

the $M_2$ second-type bits are mapped to $M_2$ low-reliability information bits in $(M-M_1)$ information bits; and the $M_3$ third-type bits are mapped to $M_3$ low-reliability information bits in $(M-M_1-M_2)$ bits.

The payload further includes J unpredictable information bits; and the J unpredictable information bits are mapped to J low-reliability information bits in the (K−M−D) information bits, where J<K, and J is a positive integer.

Possible sequences, described below by using examples, of sorting the foregoing four classified types of bit information in ascending order of polar code reliability may include but are not limited to one or more of the following:

Example 1.1

A sequence of sorting, in ascending order of polar code reliability, bits including the four classified types of bits may be:

first-type bits, second-type bits, third-type bits, fourth-type bits, CRC bits.

Based on the foregoing example of each type of bit and the foregoing sequence, an example is: first-type bits including a reserved bit, second-type bits including bandwidth information and universal control channel configuration information, third-type bits including time sequence information, fourth-type bits including an SIB indication, CRC bits.

The bits are mapped to low-reliability positions in ascending order of polar code reliability in the foregoing sorting sequence.

Example 1.2

A sequence of sorting, in ascending order of polar code reliability, bits including the four classified types of bits may be:

first-type bits, second-type bits, third-type bits, fourth-type bits, CRC bits.

Based on the foregoing example of each type of bit and the foregoing sequence, an example is: first-type bits including a reserved bit, second-type bits including universal control channel configuration information and bandwidth information, third-type bits including time sequence information, fourth-type bits including an SIB indication, CRC bits.

In Example 1.2, the second-type bits are sorted in an internal sequence. Sequences of bits of a same type can be interchanged.

The bits are mapped to low-reliability positions in ascending order of polar code reliability in the foregoing sorting sequence.

Example 1.3

A sequence of sorting, in ascending order of polar code reliability, bits including the four classified types of bits may be:

first-type bits, second-type bits, third-type bits, fourth-type bits, CRC bits.

Based on the foregoing example of each type of bit and foregoing sequence, an example is: first-type bits including a reserved bit, second-type bits including universal control channel configuration information, time sequence information, and bandwidth information, second-type bits and third-type bits including time sequence information, fourth-type bits including an SIB indication, CRC bits.

A difference between the example herein and the foregoing example lies in that the second-type bits may be combined with the third-type bits. In other words, in classified bit sets, the second-type bits and the third-type bits are classified as one type. This type, after the combination, may be classified as the second type of bits or may be classified as a third type of bits. This is not limited herein.

The bits are mapped to low-reliability positions in ascending order of polar code reliability in the foregoing sorting sequence.

Example 1.4

A sequence of sorting, in ascending order of polar code reliability, bits including the four classified types of bits may be:

first-type bits, second-type bits, third-type bits, fourth-type bits, CRC bits.

Based on the foregoing example of each type of bit and the foregoing sequence, an example is: first-type bits including a reserved bit, second-type bits and third-type bits including universal control channel configuration information, bandwidth information, and time sequence information, fourth-type bits including an SIB indication, CRC.

A difference between the example herein and the foregoing Example 1.3 lies in that the second-type bits may be combined with the third-type bits, and a bit set after the combination includes different types of bits.

The bits are mapped to low-reliability positions in ascending order of polar code reliability in the foregoing sorting sequence.

Example 1.5

A sequence of sorting, in ascending order of polar code reliability, bits including the four classified types of bits may be:

first-type bits, second-type bits, third-type bits, CRC.

Based on the foregoing example of each type of bit and the foregoing sequence, an example is: first-type bits including a reserved bit, second-type bits including universal control channel configuration information and bandwidth information, third-type bits including time sequence information, CRC.

A difference between the example herein and the foregoing example lies in that a bit set included in the payload of the PBCH may be any combination of the foregoing four types of bits. For example, the payload of the PBCH includes the foregoing classified first type of bits, second type of bits, and third type of bits. Certainly, this is not limited herein. The payload of the PBCH may alternatively include only the classified first type of bits, third type of bits, and fourth type of bits, for example, in Example 1.6.

The bits are mapped to low-reliability positions in ascending order of polar code reliability in the foregoing sorting sequence.

Example 1.6

A sequence of sorting, in ascending order of polar code reliability, bits including the four classified types of bits may be:

first-type bits, third-type bits, fourth-type bits, CRC.

Based on the foregoing example of each type of bit and the foregoing sequence, an example is: first-type bits including a reserved bit, third-type bits including time sequence information, fourth-type bits including an SIB indication, CRC.

A difference between the example herein and the foregoing example lies in that a bit set included in the payload of the PBCH may be any combination of the foregoing four types of bits. For example, the payload of the PBCH includes the foregoing classified first type of bits, third type of bits, and fourth type of bits. The payload of the PBCH may alternatively include the classified first type of bits and third type of bits, for example, in Example 1.7.

Example 1.7

A sequence of sorting, in ascending order of polar code reliability, bits including the four classified types of bits may be:

first-type bits, third-type bits, CRC.

Based on the foregoing example of each type of bit and the foregoing sequence, an example is: first-type bits including a reserved bit, third-type bits including time sequence information, CRC.

Example 1.8

A sequence of sorting, in ascending order of polar code reliability, bits including the four classified types of bits may be:

first-type bits, second-type bits, CRC.

Based on the foregoing example of each type of bit and the foregoing sequence, an example is: first-type bits including a reserved bit, second-type bits including bandwidth information, CRC.

The foregoing plurality of combinations of the classified types of bits may be freely selected. This is not limited herein. On the whole, the foregoing classification and sorting rules are followed.

The foregoing mapping method may be implemented by introducing interleaving of to-be-encoded information. For example:

For a polar code whose code length is 512, a total length of a MIB and CRC bits is 72. Therefore, 72 highest-reliability subchannels in the polar code are selected as an information bit set, and sequence numbers of the 72 subchannels are sorted as follows in ascending order of reliability: [484; 430; 488; 239; 378; 459; 437; 380; 461; 496; 351; 467; 438; 251; 462; 442; 441; 469; 247; 367; 253; 375; 444; 470; 483; 415; 485; 473; 474; 254; 379; 431; 489; 486; 476; 439; 490; 463; 381; 497; 492; 443; 382; 498; 445; 471; 500; 446; 475; 487; 504; 255; 477; 491; 478; 383; 493; 499; 502; 494; 501; 447; 505; 506; 479; 508; 495; 503; 507; 509; 510; 511].

Results obtained after cyclic redundancy check (Cyclic Redundancy Check, CRC) is performed on the MIB are $a_0$, $a_1, \ldots, a_9, a_{10}, \ldots, a_{14}, a_{15}, \ldots, a_{29}, a_{30}, \ldots, a_{39}, a_{48}, \ldots, a_{71}$, and are sequentially taken out from a sequence of sorting the polar subchannels in a reliability priority order in a table below.

The foregoing description may be represented by using FIG. 2. Based on the foregoing mapping manner, this application further provides another mapping manner, for example, a case in which there is D-CRC.

When there is D-CRC, discrete CRC bits occupy some subchannel positions. In this case, from a first-type bit to a fourth-type bit, the positions of the discrete CRC bits are first considered. In the information bit set of the polar code, subchannels occupied by the CRC bits are excluded, remaining subchannels are sorted in ascending order of reliability, the CRC bits in mapping are excluded, remaining bits are classified based on the foregoing four types in a manner in the foregoing Embodiments, and then results of the classification based on the classified bit types in the foregoing Embodiments are mapped to the information bit set.

Further, for example, by excluding polar code subchannels occupied by the discrete CRC bits, several possible sorting sequences of the MIB are as follows:

Possible sequences, described below by using examples, of sorting the foregoing four classified types of bit information in ascending order of polar code reliability may include but are not limited to one or more of the following:

Example 2.1

A sequence of sorting, in ascending order of polar code reliability, bits including the four classified types of bits may be:

first-type bits, second-type bits, third-type bits, fourth-type bits.

Based on the foregoing example of each type of bit and the foregoing sequence, an example is: first-type bits including a reserved bit, second-type bits including bandwidth information and universal control channel configuration information, third-type bits including time sequence information, fourth-type bits including an SIB indication.

The bits are mapped to low-reliability positions excluding a position of CRC in ascending order of polar code reliability in the foregoing sorting sequence.

Example 2.2

A sequence of sorting, in ascending order of polar code reliability, bits including the four classified types of bits may be:
first-type bits, second-type bits, third-type bits, fourth-type bits.

Based on the foregoing example of each type of bit and the foregoing sequence, an example is: first-type bits including a reserved bit, second-type bits including universal control channel configuration information and bandwidth information, third-type bits including time sequence information, fourth-type bits including an SIB.

The bits are mapped to low-reliability positions excluding a position of CRC in ascending order of polar code reliability in the foregoing sorting sequence.

Example 2.3

A sequence of sorting, in ascending order of polar code reliability, bits including the four classified types of bits may be:
first-type bits, second-type bits, third-type bits, fourth-type bits.

Based on the foregoing example of each type of bit and the foregoing sequence, an example is: first-type bits including a reserved bit, bits obtained after second-type bits and third-type bits including universal control channel configuration information, time sequence information, and bandwidth information are combined, fourth-type bits including an SIB indication.

The bits are mapped to low-reliability positions excluding a position of CRC in ascending order of polar code reliability in the foregoing sorting sequence.

The SIB in the foregoing embodiment may be SIB information, or may be SIB resource indication information.

Example 2.4

A sequence of sorting, in ascending order of polar code reliability, bits including the four classified types of bits may be:
first-type bits, second-type bits, third-type bits, fourth-type bits.

Based on the foregoing example of each type of bit and the foregoing sequence, an example is: first-type bits including a reserved bit, bits obtained after second-type bits and third-type bits including universal control channel configuration information, bandwidth information, and time sequence information are combined, fourth-type bits including an SIB.

The bits are mapped to low-reliability positions excluding a position of CRC in ascending order of polar code reliability in the foregoing sorting sequence.

Example 2.5

A sequence of sorting, in ascending order of polar code reliability, bits including the four classified types of bits may be: first-type bits, second-type bits, third-type bits.

Based on the foregoing example of each type of bit and the foregoing sequence, an example is: first-type bits including a reserved bit, second-type bits including universal control channel configuration information and bandwidth information, third-type bits including time sequence information.

The foregoing may alternatively include first-type bits, third-type bits, and fourth-type bits, where a sequence is: the first-type bits including a reserved bit, the third-type bits including time sequence information, and the fourth-type bits including an SIB; or
include first-type bits and third-type bits, where a corresponding sequence is: the first-type bits including a reserved bit and the third-type bits including time sequence information; or
include first-type bits and second-type bits, where a corresponding sequence is: the first bits including a reserved bit and the second-type bits including bandwidth information.

The bits are mapped to low-reliability positions excluding a position of CRC in ascending order of polar code reliability in the foregoing sorting sequence.

The placement of the position of the CRC does not strictly follow the foregoing criterion.

For a polar code whose code length is 512, a total length of a MIB and CRC is 72. Therefore, 72 highest-reliability subchannels in the polar code are selected as an information bit information bit set. Sorting of sequence numbers of the 72 subchannels in ascending order of reliability is the same as described previously.

The 72 information bits include 24 bits of CRC, and an interleaver of D-CRC generated by using the CRC is as follows:
[1, 3, 6, 9, 12, 14, 16, 18, 19, 21, 23, 26, 27, 28, 30, 31, 34, 35, 37, 40, 42, 46, 47, 48, 0, 2, 4, 7, 10, 13, 15, 17, 20, 22, 24, 29, 32, 36, 38, 41, 43, 49, 5, 8, 11, 25, 33, 39, 44, 50, 45, 51, 52, 53, 54, 55, 56, 57, 58, 59, 60, 61, 62, 63, 64, 65, 66, 67, 68, 69, 70, 71].

Because a length of a MIB part is 72−24=48, CRC bits obtained after D-CRC interleaving are placed in positions whose sequence numbers are greater than 48 in the foregoing sequence.

Based on a combination of a D-CRC interleaving pattern and the information bit set of the polar code, positions for placing D-CRC information in the polar code are obtained as follows:
[443, 478, 489, 491, 492, 493, 494, 495, 496, 497, 498, 499, 500, 501, 502, 503, 504, 505, 506, 507, 508, 509, 510, 511]

Bits for placing D-CRC are removed from the information bit set of the polar code. A sorting sequence of a remaining part in ascending order of reliability is:
[484, 430, 488, 239, 378, 459, 437, 380, 461, 351, 467, 438, 251, 462, 442, 441, 469, 247, 367, 253, 375, 444, 470, 483, 415, 485, 473, 474, 254, 379, 431, 486, 476, 439, 490, 463, 381, 382, 445, 471, 446, 475, 487, 255, 477, 383, 447, 479]. The foregoing detailed description may be represented by FIG. 3.

This application further provides an embodiment. Based on the foregoing first embodiment and second embodiment, discrete CRC bits and other CRC bits are specifically sorted. The discrete CRC bits are sorted in a manner in the foregoing second embodiment, and then the other CRC bits are sorted in a manner in the first embodiment. Details are not described herein again. For another example, it is assumed that a result obtained after cyclic redundancy check (CRC) is performed on broadcast signaling (signaling carried on a PBCH channel) is $a_0, a_1, \ldots, a_{13}, a_{14}, \ldots, a_{23}, a_{24}, \ldots, a_{39}$, where $a_{14}, \ldots, a_{23}$ are reserved bits (10 bits) and $a_{24}, \ldots, a_{39}$ correspond to check bits (and may include a mask). It is assumed that 10 low-reliability information bits in a polar code are {79, 106, 55, 105, 92, 102, 90, 101, 47, 89}. In this case, when the 10 reserved bits are mapped to the 10 low-reliability information bits, $u(79)=a_{14}$, $u(106)=a_{15}$, $u(55)=a_{16}$, $u(105)=a_{17}$, $u(92)=a_{18}$, $u(102)=a_{19}$, $u(90)=a_{20}$, $u(101)=a_{21}$, $u(47)=a_{22}$, and $u(89)=a_{23}$ may be obtained by using an interleaver, to further complete a process of mapping the reserved bits to the information bits. Similarly, to map remaining bits of the broadcast signaling to remaining information bits in the polar code, refer to the foregoing method. To avoid repetition, details are not described herein again.

103. Perform polar code encoding on the mapped bits, to obtain encoded encoding bits.

104. Send the encoding bits.

For example, when a wireless communications device prepares to send broadcast signaling by using a PBCH (Physical Broadcast Channel) channel, polar encoding may be performed on the broadcast signaling first. An encoding output of the polar code may be represented by a formula (1):

$$x_1^N = u_1^N G_N. \quad (1)$$

where $u_1^N = \{u_1, u_2, \ldots, u_N\}$ is a binary row vector whose length is N; $G_N$ is an N*N matrix, $G_N = B_N F^{\otimes n}$, N is a length of the encoded encoding bits, $n \geq 0$, $$F = \begin{bmatrix} 1 & 0 \\ 1 & 1 \end{bmatrix},$$

$B_N$ is a transpose matrix, and $F^{\otimes n}$ is a Kronecker power (Kronecker power) and is defined as $F^{\otimes n} = F \otimes F^{\otimes(n-1)}$.

In an encoding process of the polar code, some bits in $u_1^N$ are used to carry information (that is, information that needs to be sent to a receive end). These bits are referred to as information bits. A set of indexes of these bits is denoted as A. The remaining bits, referred to as frozen bits, have fixed values and may be, for example, normally set to 0.

According to the method in this embodiment of the present invention, the M predictable information bits are mapped to the M low-reliability information bits in the K information bits of the polar code respectively, and the D cyclic redundancy check CRC bits are mapped to the D high-reliability information bits in the remaining information bits of the K information bits, to obtain the mapped bits. Then the encoded polar codes may be obtained based on the encoding process shown in Formula (1). In other words, the encoded encoding bits are obtained.

The encoded polar code output after encoding processing is performed by using a polar code encoder may be simplified as $x_1^N = u_A G_N(A)$, where $u_A$ is an information bit set in $u_1^N$, $u_A$ is a row vector whose length is K, K is a quantity of information bits, $G_N(A)$ is a submatrix obtained by using rows corresponding to indexes in a set A in $G_N$, and $G_N(A)$ is a K*N matrix.

Based on the foregoing technical solution, during sending of the broadcast signaling, mapping is performed first based on reliability values of information bits in the polar code, and polar encoding is then performed on the mapped bits. In this case, useful bits in the broadcast signaling can be prevented from being mapped to low-reliability information bits, thereby improving broadcast signaling transmission reliability.

Optionally, in an embodiment, the M low-reliability information bits include M information bits whose reliability is less than a preset threshold, or the M low-reliability information bits include M lowest-reliability information bits in the K information bits.

Optionally, in another embodiment, before M reserved bits of the broadcast signaling are respectively mapped to M low-reliability information bits in the K information bits of the polar code, the K information bits may be sorted first based on reliability values of the K information bits. In this case, when the M reserved bits of the broadcast signaling are respectively mapped to the M low-reliability information bits in the K information bits of the polar code, the M reserved bits may be respectively mapped to the M low-reliability information bits in the K information bits based on a sorting result.

For example, a description is made by using an example in which a code length of the polar code is 128 bits. The polar code includes 40 information bits. The 40 information bits are sorted in descending order of reliability, to obtain sorted indexes as follows:

{127, 126, 125, 23, 119, 111, 95, 124, 122, 63, 121, 118, 117, 115, 110, 109, 107, 94, 93, 103, 91, 62, 120, 87, 61, 116, 114, 59, 108, 113, 79, 106, 55, 105, 92, 102, 90, 101, 47, 89}.

It is assumed that a length of the broadcast signaling is 40 bits. The 40 bits include 10 reserved bits. In this case, the 10 reserved bits should be respectively mapped to information bits corresponding to {79, 106, 55, 105, 92, 102, 90, 101, 47, 89}. The remaining bits of the broadcast signaling are mapped to information bits other than the foregoing 10 bits.

Optionally, in another embodiment, a reliability value of the information bit is determined based on a bit capacity, a Bhattacharyya distance Bhattacharyya parameter, or an error probability.

For example, when a bit capacity is used to measure reliability of the information bits, a bit capacity of each information bit in the polar code may be determined first, and a bit capacity value is used to represent a reliability value of an information bit, where a bit having a large bit capacity has high reliability.

Alternatively, when the Bhattacharyya parameter is used to measure reliability of the information bits, a Bhattacharyya parameter of each information bit in the polar code may be determined, and a Bhattacharyya parameter value is used to represent a reliability value of an information bit, where an information bit having a small Bhattacharyya parameter value has high reliability.

Figure 4:
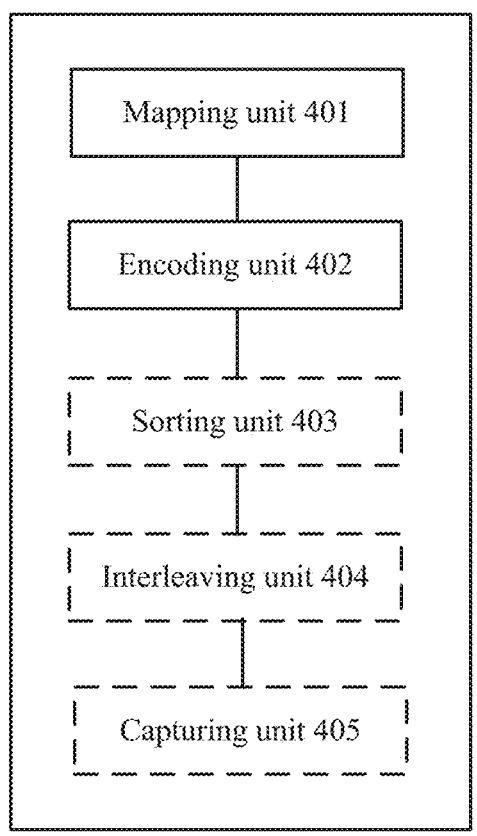
FIG. 4 is a schematic block diagram of a polar encoding apparatus according to an embodiment of the present invention.

FIG. 4 is a schematic block diagram of a polar encoding apparatus according to an embodiment of the present invention. The encoding apparatus 400 in FIG. 4 may be located at a base station or an access terminal (for example, a base station 102 and an access terminal 116), and includes a mapping unit 401 and an encoding unit 402.

The mapping unit 401 is configured to: map M reserved bits of broadcast signaling respectively to M low-reliability information bits in K information bits of a polar code, and map remaining bits of the broadcast signaling to remaining information bits of the K information bits to obtain mapped bits, where M<K, and M and K are both positive integers.

It should be understood that the broadcast signaling is signaling carried on a broadcast channel, for example, a physical broadcast channel (PBCH). The broadcast signaling usually includes several reserved bits that actually do not carry useful information. In this case, in an encoding process of the polar code, the reserved bits are mapped to low-reliability information bits. Even if the reserved bits are changed during transmission, correct decoding of the broadcast signaling is not affected.

It should also be understood that a measurement form of reliability is not limited in this embodiment of the present invention. For example, reference may be made to an existing polar code reliability metric, such as a bit capacity, a Bhattacharyya distance Bhattacharyya parameter, or an error probability.

For example, it is assumed that a result obtained after cyclic redundancy check is performed on broadcast signaling (signaling carried on a PBCH channel) is $a_0, a_1, \ldots, a_{13}$, $a_{14}, \ldots, a_{23}, a_{24}, \ldots,$ and $a_{39}$. $a_{14}, \ldots, a_{23}$ are reserved bits (10 bits) and $a_{24}, \ldots, a_{39}$ correspond to check bits (and may include a mask). It is assumed that 10 low-reliability information bits in a polar code are {79, 106, 55, 105, 92, 102, 90, 101, 47, 89}. In this case, when the 10 reserved bits are mapped to the 10 low-reliability information bits, $u(79)=a_{14}$, $u(106)=a_{15}$, $u(55)=a_{16}$, $u(105)=a_{17}$, $u(92)=a_{18}$, $u(102)=a_{19}$, $u(90)=a_{20}$, $u(101)=a_{21}$, $u(47)=a_{22}$, and $u(89)=a_{23}$ may be obtained by using an interleaver, to further complete a process of mapping the reserved bits to the information bits. Similarly, to map remaining bits of the broadcast signaling to remaining information bits in the polar code, refer to the foregoing method. To avoid repetition, details are not described herein again.

The encoding unit 402 is configured to perform polar encoding on the mapped bits, to obtain encoded encoding bits.

Herein, for a process of performing polar encoding on the mapped bits by the encoding unit, refer to the description in the foregoing embodiments. To avoid repetition, details are not described herein again.

Based on the foregoing technical solution, during sending of the broadcast signaling, mapping is performed first based on reliability values of information bits in the polar code, and polar encoding is then performed on the mapped bits. In this case, useful bits in the broadcast signaling can be prevented from being mapped to low-reliability information bits, thereby improving broadcast signaling transmission reliability.

Optionally, in an embodiment, the M low-reliability information bits include M information bits whose reliability is less than a preset threshold, or the M low-reliability information bits include M lowest-reliability information bits in the K information bits.

Optionally, in another embodiment, the encoding apparatus 400 further includes a sorting unit 403.

The sorting unit 403 is configured to sort the K information bits based on reliability values of the K information bits.

In this case, the encoding unit 402 is specifically configured to map the M reserved bits respectively to the M low-reliability information bits in the K information bits based on a sorting result.

For example, a description is made by using an example in which a code length of the polar code is 128 bits. The polar code includes 40 information bits. The 40 information bits are sorted in descending order of reliability, to obtain sorted indexes as follows:

{127, 126, 125, 23, 119, 111, 95, 124, 122, 63, 121, 118, 117, 115, 110, 109, 107, 94, 93, 103, 91, 62, 120, 87, 61, 116, 114, 59, 108, 113, 79, 106, 55, 105, 92, 102, 90, 101, 47, 89}.

It is assumed that a length of the broadcast signaling is 40 bits. The 40 bits include 10 reserved bits. In this case, the 10 reserved bits should be respectively mapped to information bits corresponding to { 79, 106, 55, 105, 92, 102, 90, 101, 47, 89}. The remaining bits of the broadcast signaling are mapped to information bits other than the foregoing 10 bits.

Optionally, in another embodiment, a reliability value of the information bit is determined based on a bit capacity, a Bhattacharyya distance Bhattacharyya parameter, or an error probability.

For example, when a bit capacity is used to measure reliability of the information bits, a bit capacity of each information bit in the polar code may be determined first, and a bit capacity value is used to represent a reliability value of an information bit, where a bit having a large bit capacity has high reliability.

Alternatively, when the Bhattacharyya parameter is used to measure reliability of the information bits, a Bhattacharyya parameter of each information bit in the polar code may be determined, and a Bhattacharyya parameter value is used to represent a reliability value of an information bit, where an information bit having a small Bhattacharyya parameter value has high reliability.

Optionally, in another embodiment, the encoding apparatus 400 further includes an interleaving unit 404 and a capturing unit 405. The interleaving unit 404 and the capturing unit 405 may be located at the rate matching apparatus in the wireless communications device discussed above. In this case, the rate matching apparatus and the polar code encoder together form the polar encoding apparatus 400.

The interleaving unit 404 is configured to perform sorting and congruential interleaving on the encoded encoding bits, to obtain interleaved encoding bits.

The capturing unit 405 is configured to input first E bits of the interleaved encoding bits into a cyclic buffer based on a preset value E.

Alternatively, the capturing unit 405 is configured to: perform inversion processing on the interleaved encoding bits; and input, into a cyclic buffer based on a preset value E, first E bits of the encoding bits that are obtained after inversion processing.

It should be understood that the preset value E is related to a frame format of the broadcast signaling. In this way, this embodiment of the present invention can further improve a code rate.

Optionally, in another embodiment, the interleaving unit 404 is specifically configured to: obtain a congruential sequence based on a length of the encoded encoding bits; then, perform sorting processing on the congruential sequence according to a preset rule, to obtain a reference sequence, and determine a mapping function based on the congruential sequence and the reference sequence; and finally perform interleaving on the encoded encoding bits according to the mapping function, to obtain the interleaved encoding bits.

Specifically, for a process in which the interleaving unit 404 performs interleaving on the encoded encoding bits, refer to detailed description in the foregoing embodiment. To avoid repetition, details are not described herein again.

Optionally, in another embodiment, the interleaving unit 404 is specifically configured to determine a congruential sequence according to the following formula (3):

$$x(0)=x_0,$$

$$x(n+1)=[a*x(n)+c] \bmod m, n=0,1,\ldots,(N-2) \quad (3)$$

where N is a length of the encoded encoding bits, $x_0$, a, c, and m are specific parameters, and $x(0), x(1), \ldots, x(N-1)$ is the congruential sequence.

It should be understood that, that N is a length of the encoded encoding bits means that N is a code length of the polar code.

Specifically, it is assumed that Q is a given positive integer. When two integers A and B are separately divided by Q, obtained remainders are the same. In this case, it is called that A and B are congruential for a modulo Q. A formula (2) represents a linear congruential method, where m represents a modulus, m>0, a represents a multiplier, c represents an increment, and x(0) represents a start value.

Optionally, in another embodiment, $x_0=4831$, $a=7^5$, $c=0$, and $m=2^{31}-1$.

Figure 5:
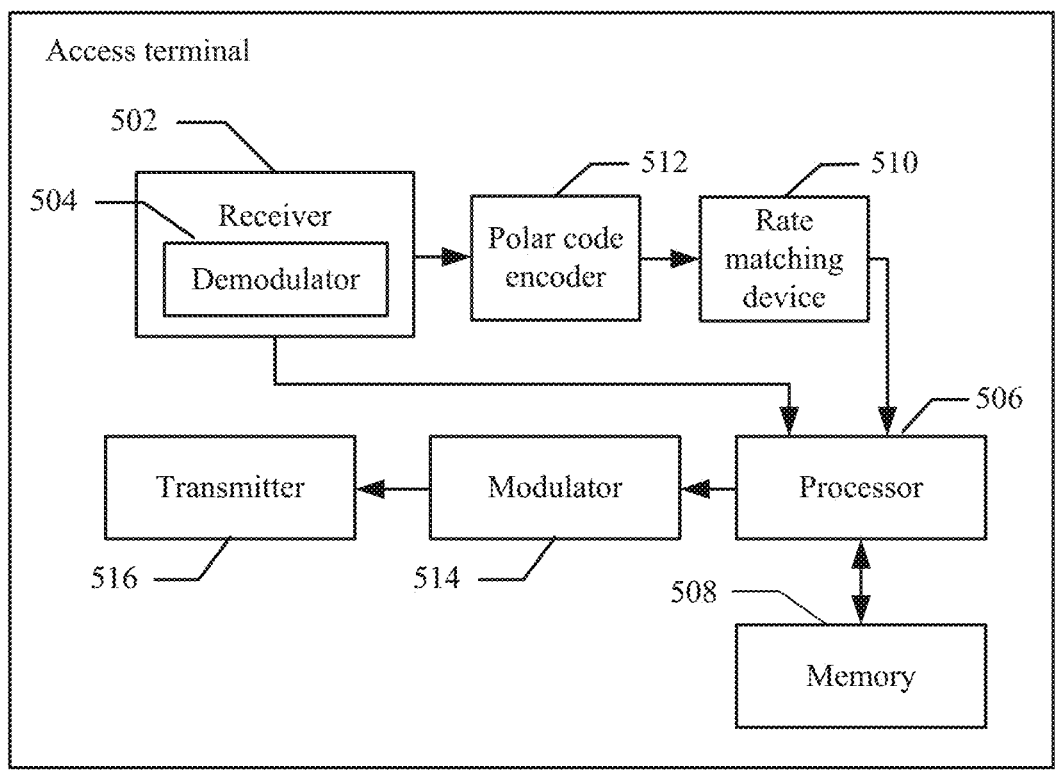
FIG. 5 is a schematic diagram of an access terminal that performs the foregoing polar encoding method in a wireless communications system.

FIG. 5 is a schematic diagram of an access terminal that helps perform the foregoing polar encoding method in a wireless communications system. The access terminal 500 includes a receiver 502. The receiver 502 is configured to: receive a signal from, for example, a receive antenna (not shown), perform a typical action (for example, filtering, amplification, or down-conversion) on the received signal, and digitize an adjusted signal to obtain a sample. The receiver 502 may be, for example, a minimum mean square error (Minimum Mean Square Error, MMSE) receiver. The access terminal 500 may further include a demodulator 504. The demodulator 504 may be configured to demodulate a received symbol and provide the symbol to a processor 506 for channel estimation. The processor 506 may be a dedicated processor configured to analyze information received by the receiver 502 and/or generate information sent by a transmitter 516; or a processor configured to control one or more components of the access terminal 500; and/or a controller configured to analyze information received by the receiver 502, generate information sent by a transmitter 516, and control one or more components of the access terminal 500.

The access terminal 500 may additionally include a memory 508. The memory 508 may be operably coupled to the processor 506, and store the following data: data to be sent, received data, and any other appropriate information related to execution of various actions and functions described in this specification. The memory 508 may additionally store a protocol and/or an algorithm related to processing of a polar code.

It may be understood that a data storage apparatus (for example, the memory 508) described herein may be a volatile memory or a nonvolatile memory, or may include both a volatile memory and a nonvolatile memory. By way of example but not for limitation, the nonvolatile memory may include a read-only memory (Read-Only Memory, ROM), a programmable read-only memory (Programmable ROM, PROM), an erasable programmable read-only memory (Erasable PROM, EPROM), an electrically erasable programmable read-only memory (Electrically EPROM, EEPROM), or a flash memory. The volatile memory may include a random access memory (Random Access Memory, RAM), used as an external cache. By way of example but not for limitation, many forms of RAMs, for example, a static random access memory (Static RAM, SRAM), a dynamic random access memory (Dynamic RAM, DRAM), a synchronous dynamic random access memory (Synchronous DRAM, SDRAM), a double data rate synchronous dynamic random access memory (Double Data Rate SDRAM, DDR SDRAM), an enhanced synchronous dynamic random access memory (Enhanced SDRAM, ESDRAM), a synchlink dynamic random access memory (Synchlink DRAM, SLDRAM), and a direct rambus random access memory (Direct Rambus RAM, DR RAM), may be used. The memory 508 in the system and method described in this specification is intended to include, but is not limited to, these memories and any other memories of appropriate types.

In addition, the access terminal 500 further includes a polar code encoder 512 and a rate matching device 510. In actual application, the receiver 502 may further be coupled to the rate matching device 510. The rate matching device 510 may be basically similar to the rate matching apparatus 205 in FIG. 2. The polar code encoder 512 is basically similar to the polar code encoder discussed above.

The polar code encoder 512 may be configured to: determine that a payload of broadcast signaling includes D cyclic redundancy check CRC bits and M predictable information bits;
  map the M predictable information bits to M low-reliability information bits in K information bits of a polar code respectively, and map the D cyclic redundancy check CRC bits to D high-reliability information bits in remaining information bits of the K information bits, to obtain mapped bits, where M<K, and D, M, and K are all positive integers; and
  perform polar encoding on the mapped bits, to obtain encoded encoding bits.

According to this embodiment of the present invention, when the broadcast signaling is sent, it is first determined that the payload of the broadcast signaling includes the D cyclic redundancy check CRC bits and the M predictable information bits; the M predictable information bits are mapped to the M low-reliability information bits in the K information bits of the polar code respectively, the D cyclic redundancy check CRC bits are mapped to the D high-reliability information bits in the remaining information bits of the K information bits, to obtain the mapped bits, where M<K, and D, M, and K are all positive integers; and polar encoding is performed on the mapped bits, to obtain the encoded encoding bits, so that reliability of broadcast signaling transmission can be improved.

Optionally, in an embodiment, the M low-reliability information bits include M information bits whose reliability is less than a preset threshold, or the M low-reliability information bits include M lowest-reliability information bits in the K information bits.

Optionally, in another embodiment, the M predictable information bits include one or more of the following bit combinations: $M_1$ first-type bits, $M_2$ second-type bits, or $M_3$ third-type bits, where the first-type bit is a reserved bit, the second-type bit includes an information bit whose value keeps unchanged, the third-type bit is a predictable information bit whose value is content of time sequence information and varies, $M_1$, $M_2$, and $M_3$ are all positive integers, $M_1<=M$, $M_2<=M$, and $M_3<=M$.

Optionally, in another embodiment, when the M predictable information bits include the $M_1$ first-type bits and the $M_2$ second-type bits or include the $M_1$ reserved bits and the $M_3$ second-type bits, the $M_1$ first-type bits are mapped to $M_1$ low-reliability information bits in M information bits.

Optionally, in another embodiment, the $M_2$ second-type bits are mapped to $M_2$ low-reliability information bits in remaining information bits of the M information bits; or the $M_1$ first-type bits are mapped to $M_1$ low-reliability information bits in M information bits; and the $M_3$ second-type bits are mapped to $M_3$ low-reliability information bits in remaining information bits of the M information bits.

Optionally, in another embodiment, the polar code encoder 512 is specifically configured to: when the M predictable information bits include the $M_1$ first-type bits, the $M_2$ second-type bits, and the $M_3$ second-type bits, map the $M_1$ first-type bits to $M_1$ low-reliability information bits in M information bits.

Optionally, in another embodiment, the polar code encoder 512 is specifically configured to: map the $M_2$ second-type bits to $M_2$ low-reliability information bits in $(M-M_1)$ information bits; and
  map the $M_3$ third-type bits to $M_3$ low-reliability information bits in $(M-M_1-M_2)$ bits.

Optionally, in another embodiment, the payload further includes J unpredictable information bits, and the polar code encoder 512 is specifically further configured to map the J unpredictable information bits to J low-reliability information bits in the (K−M−D) information bits, where J<K, and J is a positive integer.

Optionally, in another embodiment, the polar code encoder 512 sorts the K information bits based on reliability values of the K information bits. Then the polar code encoder 512 maps M reserved bits respectively to the M low-reliability information bits in the K information bits based on a sorting result.

Optionally, in another embodiment, a reliability value of the information bit is determined based on a bit capacity, a Bhattacharyya distance Bhattacharyya parameter, or an error probability.

Figure 6:
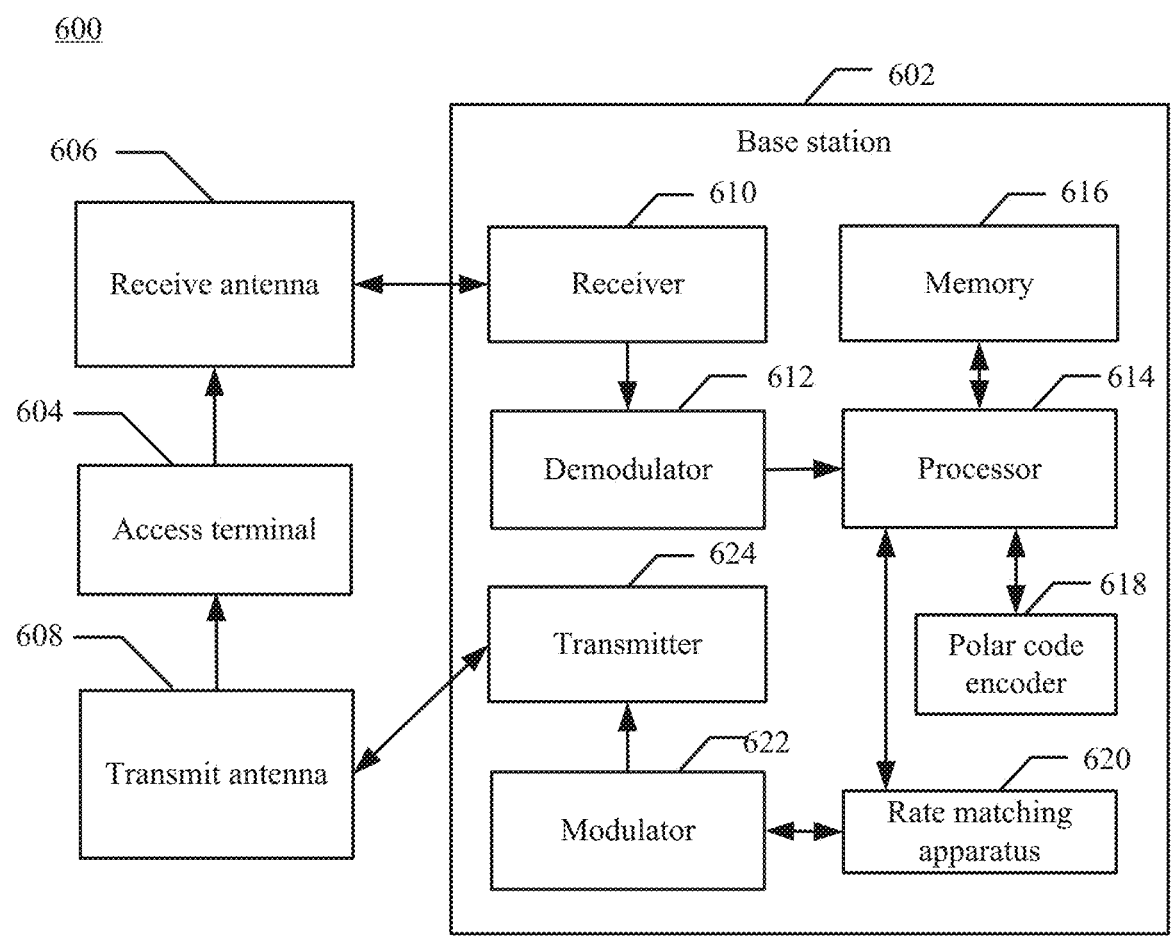
FIG. 6 is a schematic diagram of a system that performs the foregoing polar encoding method in a wireless communications environment.
Figure 7:
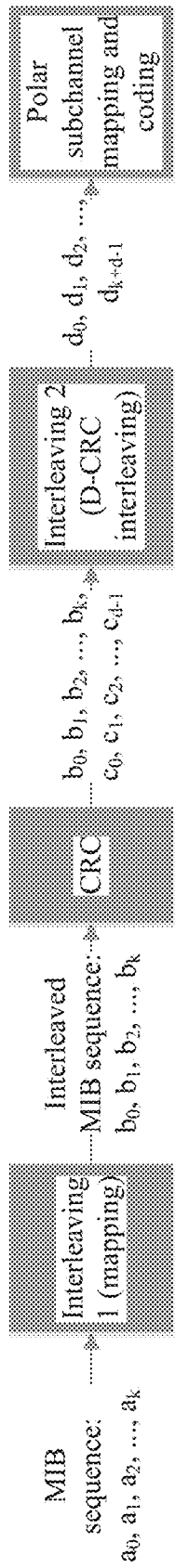
FIG. 7 is a schematic diagram of a system that performs the foregoing polar encoding method in a wireless communications environment.

FIG. 6 is a schematic diagram of a system that helps perform the foregoing polar encoding method in a wireless communications environment. The system 600 includes a base station 602 (for example, an access point, or a NodeB or an eNB). The base station 602 includes a receiver 610 that receives a signal from one or more access terminals 604 by using a plurality of receive antennas 606, and a transmitter 624 that transmits a signal to the one or more access terminals 604 by using a transmit antenna 608. The receiver 610 may receive information from the receive antenna 606, and may be operably associated with a demodulator 612 that demodulates the received information. A processor 614 similar to the processor described in FIG. 7 is configured to analyze a demodulated symbol. The processor 614 is connected to a memory 616. The memory 616 is configured to store data that needs to be sent to the access terminal 604 (or different base stations (not shown)), or data that needs to be received from the access terminal 604 (or different base stations (not shown)), and/or any other appropriate information related to execution of various actions and functions described in this specification. The processor 614 may further be coupled to a polar code encoder 618 and a rate matching apparatus 620.

The polar code encoder 618 may be configured to: determine that a payload of broadcast signaling includes D cyclic redundancy check CRC bits and M predictable information bits;
  map the M predictable information bits to M low-reliability information bits in K information bits of a polar code respectively, and map the D cyclic redundancy check CRC bits to D high-reliability information bits in remaining information bits of the K information bits, to obtain mapped bits, where M<K, and D, M, and K are all positive integers; and
  perform polar encoding on the mapped bits, to obtain encoded encoding bits.

In addition, in the system 600, a modulator 622 may multiplex a frame, for transmission by using the transmit antenna 608 by the transmitter 624 to the access terminal 604. It may be understood that the polar code encoder 618, the rate matching apparatus 620 and/or the modulator 622 may be a part of the processor 614 or a part of a plurality of processors (not shown), although they are shown as separate from the processor 614.

It may be understood that these embodiments described in this specification may be implemented by hardware, software, firmware, middleware, microcode, or a combination thereof. For implementation in a hardware manner, a processing unit may be implemented in one or more application specific integrated circuits (Application Specific Integrated Circuits, ASIC), a digital signal processor (Digital Signal Processor DSP), a digital signal processing device (DSP Device, DSPD), a programmable logic device (Programmable Logic Device, PLD), a field-programmable gate array (Field-Programmable Gate Array, FPGA), a processor, a controller, a microcontroller, a microprocessor, another electronic unit configured to perform the functions in this application, or a combination thereof.

When the embodiments are implemented by software, firmware, middleware or microcode, program code or a code segment, the software, firmware, middleware or microcode, program code or code segment may be stored in a machine readable medium such as a storage component. The code segment may represent any combination of a process, a function, a subprogram, a program, a routine, a subroutine, a module, a software component, a class, an instruction, a data structure or a program statement. The code segment may be coupled to another code segment or a hardware circuit by transferring and/or receiving information, data, an independent variable, a parameter, or memory content. The information, independent variable, parameter, data, and the like may be transferred, forwarded or sent in any appropriate manner, including memory sharing, message transfer, token transfer, and network transmission.

For implementation in a software manner, the technologies described in this specification may be implemented by using modules (for example, processes or functions) that execute the functions described in this specification. Software code may be stored in a memory unit and executed by using a processor. The memory unit may be implemented in the processor or outside the processor. When the memory unit is implemented outside the processor, the memory unit may be coupled to the processor in a communications manner by using various measures known in the art.

It should be understood that all the foregoing apparatus embodiments may be implemented according to the steps in the method embodiments. Details are not described herein again.

In the embodiments of the present invention, sequence numbers of the foregoing processes do not mean execution sequences. The execution sequences of the processes should be determined according to functions and internal logic of the processes, and should not be construed as any limitation on the implementation processes of the embodiments of the present invention.

A person of ordinary skill in the art may be aware that, in combination with the examples described in the embodiments disclosed in this specification, units and algorithm steps may be implemented by electronic hardware, computer software, or a combination thereof. To clearly describe the interchangeability between the hardware and the software, the foregoing has generally described compositions and steps of each example according to functions. Whether the functions are performed by hardware or software depends on particular applications and design constraint conditions of the technical solutions. A person skilled in the art may use different methods to implement the described functions for each particular application, but it should not be considered that the implementation goes beyond the scope of the present invention.

It may be clearly understood by a person skilled in the art that, for the purpose of convenient and brief description, for a detailed working process of the foregoing system, apparatus, and unit, reference may be made to a corresponding process in the foregoing method embodiments, and details are not described herein again.

In the several embodiments provided in this application, it should be understood that the disclosed system, apparatus, and method may be implemented in other manners. For example, the described apparatus embodiment is merely an example. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented through some interfaces, indirect couplings or communication connections between the apparatuses or units, or electrical connections, mechanical connections, or connections in other forms.

The units described as separate parts may or may not be physically separate, and parts displayed as units may or may not be physical units, that is, may be located in one position, or may be distributed on a plurality of network units. A part or all of the units may be selected according to actual needs to achieve the objectives of the solutions in the embodiments of the present invention.

In addition, functional units in the embodiments of the present invention may be integrated into one processing unit, or each of the units may exist alone physically, or two or more units are integrated into one unit. The integrated unit may be implemented in a form of hardware, or may be implemented in a form of a software functional unit.

When the integrated unit is implemented in the form of a software functional unit and sold or used as an independent product, the integrated unit may be stored in a computer-readable storage medium. Based on such an understanding, the technical solutions of the present invention essentially, or the part contributing to the prior art, or all or a part of the technical solutions may be implemented in the form of a software product. The software product is stored in a storage medium and includes several instructions for instructing a computer device (which may be a personal computer, a server, a network device, or the like) to perform all or a part of the steps of the method described in the embodiments of the present invention. The foregoing storage medium includes any medium that can store program code, such as a USB flash drive, a removable hard disk, a read-only memory (ROM, Read-Only Memory), a random access memory (RAM, Random Access Memory), a magnetic disk, or an optical disc.

The foregoing descriptions are merely specific implementations of the present invention, but are not intended to limit the protection scope of the present invention. Any modification or replacement readily figured out by a person skilled in the art within the technical scope disclosed in the present invention shall fall within the protection scope of the present invention. Therefore, the protection scope of the present invention shall be subject to the protection scope of the claims.

In an embodiment, the polar code encoder is configured to: determine that a payload of broadcast signaling includes D cyclic redundancy check CRC bits and M predictable information bits; map the M predictable information bits respectively to M low-reliability subchannels in subchannels corresponding to K information bits of a polar code, and map the D cyclic redundancy check CRC bits to D high-reliability subchannels in subchannels corresponding to remaining information bits of the K information bits, to obtain mapped bits, where M is less than or equal to (K−D), and D, M, and K are all positive integers; and perform polar encoding on the mapped bits, to obtain encoded bits.

In addition, the transmitter may subsequently transfer, on a channel, bits that have been processed by the rate matching apparatus. For example, the transmitter may send related data to another different wireless communications apparatus (not shown).

The foregoing M low-reliability subchannels in the subchannels corresponding to the K information bits of the polar code are consistent with the description of the M low-reliability information bits in the K information bits of the polar code in the foregoing embodiments. To describe relationships between information bits and subchannels corresponding to the information bits more clearly, the M low-reliability information bits in the K information bits of the polar code in the foregoing embodiments may further be described as follows: K subchannels are selected from the subchannels of the polar code, the K information bits are mapped to the selected K subchannels, M low-reliability subchannels are then selected from the K subchannels, and M information bits are mapped to the selected M subchannels.

A specific process in which the foregoing polar code encoder performs processing is further described below in detail.

In the foregoing embodiments, a payload of a PBCH is classified into four types depending on whether content of an access service is variable. Herein, in addition to the foregoing four types of bits, a fifth type of bits is added depending on different scenarios in which a bit type varies. The fifth type of bits includes bits of different bit types in different scenarios. For example, the one or more bits that are classified as third-type bits carry a specific type of content in a first scenario, and may be classified as second-type bits based on the content that is carried in the first scenario. These bits carry another type of content in a second scenario, and may be classified as third-type bits based on the content that is carried in the second scenario. In other words, these bits that carry different content and belong to different types in different scenarios are classified as fifth-type bits.

Cases of fifth-type bits are described below in detail based on different scenarios:

(1) Some bits carry different content and belong to different types in different scenarios. A specific type of bits carries one type of content in a first scenario and carries another type of content in a second scenario: Some bits carry a specific type of content in the first scenario, and the one or more bits carry another type of content in the second scenario. In other words, these bits that carry different content in different scenarios and belong to different types may be classified as fifth-type bits.

For example, among third-type bits, in a low-frequency application scenario, some bits (for example, a synchronization block index, SSBI) that represent a time sequence may indicate a configuration that often changes. In this case, these bits may be classified as fourth-type bits. These bits that represent a time sequence are also used to represent a time sequence in a high-frequency scenario. When these bits are used to represent a time sequence, these bits are classified as third-type bits. That is, the one or more bits are classified as third-type bits in a high-frequency scenario, and may further be classified as fourth-type bits in a low-frequency scenario. In other words, these bits that carry different content in different scenarios and belong to different types are classified as fifth-type bits.

(2) Some bits carry same content in different scenarios. However, these bits that carry the same content belong to different types in different scenarios.

One or more bits are first-type bits in some scenarios, and are second-type bits or fourth-type bits in other application scenarios. However, such bits carry same content. For example, some system configuration information may belong to the fourth type during working in a same cell. During a cell handover, such configuration information is notified in advance in another way. Therefore, the configuration information is known before decoding, and may be classified as first-type bits.

For another example, pilot density control signaling belongs to the fourth type of bits in a broadband application scenario, and belongs to the second type of bits in a narrowband scenario. The one or more bits are classified as fifth-type bits.

(3) There is still a special case for such bits that carry different content in different scenarios: One or more bits carry one kind of content in a first scenario, but these bits do not carry content in a second scenario. In other words, in different scenarios, the bit may or may not carry content.

For example, among third-type bits, bits used to indicate a synchronization block index SSBI in a high-frequency scenario do not carry information in a low-frequency scenario, and the one or more bits may be classified as fifth-type bits.

For another example, some bandwidth configuration indication signaling belongs to the fourth type of bits and exists only in a high-frequency scenario. Bits used to carry such signaling do not carry information in a low-frequency scenario. In this case, the one or more bits may be classified as fifth-type bits.

The following further describes in detail how fifth-type bits are mapped to corresponding subchannels of the polar code.

Generally, the M predictable information bits include $M_5$ fifth-type bits, and mapping of the $M_5$ fifth-type bits to M low-reliability information bits in M information bits specifically includes:

mapping the $M_5$ fifth-type bits to one or more subchannel combinations below, where the one or more subchannel combinations include:

$M_5$ subchannels in subchannels corresponding to $(M_1+M_5)$ first-type bits, $M_5$ subchannels in subchannels corresponding to $(M_2+M_5)$ second-type bits, $M_5$ subchannels in subchannels corresponding to $(M_3+M_5)$ third-type bits, $M_5$ subchannels in subchannels corresponding to $(M_4+M_5)$ fourth-type bits, or $M_5$ subchannels between $M_2$ subchannels corresponding to $M_2$ second-type bits and $M_3$ subchannels corresponding to $M_3$ third-type bits.

Generally, depending on different application scenarios, a fifth-type bit is mapped based on content carried by the fifth-type bit. If content carried in the one or more bits belongs to any one of the first type of bits to the fourth type of bits, mapping is performed based on a bit mapping manner of the bit type. Further processing is performed according to an actual requirement, unless there is a special setting such as a system setting, for example, a setting based on priorities of different scenarios.

The following further describes the foregoing mapping process based on different manners in which the fifth-type bits are classified:

(1) For a fifth-type bit, if the fifth-type bit belongs to the following case: carrying one kind of content in a first scenario and carrying another kind of content in a second scenario, the bit carries one kind of content in the first scenario, and the bit carries another kind of content in the second scenario. The bit carries different content and belongs to different types in different scenarios.

The fifth-type bit may be mapped based on importance or a priority of using one or more bits in an application scenario.

For example, the third type of bits is one or more bits used to indicate, for example, an SSBI in a high-frequency scenario. That is, in a high-frequency scenario, the one or more bits are classified as third-type bits. In a low-frequency scenario, the one or more bits may indicate a configuration that often changes. That is, the one or more bits may be classified as fourth-type bits in a low-frequency scenario. Generally, the one or more bits are classified as fifth-type bits because of the foregoing characteristics. When such bits are mapped to the subchannels of the polar code: In a high-frequency scenario, the bit carries content of a third-type bit, and the one or more bits are mapped to positions of subchannels corresponding to third-type bits; or in a low-frequency scenario, the one or more bits are mapped to positions of subchannels corresponding to fourth-type bits.

Further, if these bits are idle on a low frequency band, or values of these bits can be directly obtained, the one or more bits may be classified as first-type bits. In a low-frequency scenario, such bits are mapped to positions of subchannels corresponding to first-type bits. There is still another consideration. If a system and a scenario do not support such adjustment based on scenarios, at an initial stage of system design, a consideration should be taken based on priorities of different scenarios. For example, if a low-frequency scenario has a higher use density, the one or more bits in the entire system are processed in a manner of mapping a first-type bit or a fourth-type bit. On the contrary, if the high-frequency scenario is more important, the one or more bits are processed in a manner of mapping a third-type bit.

(2) Some bits carry same content in different scenarios, but the bits that carry the same content belong to different types in different scenarios. When such bits are mapped to the subchannels of the polar code, handover performance of a system may be considered preferentially during system design, and these bits are then mapped to low-reliability positions in the subchannels of the polar code, for example, before a subchannel corresponding to a first-type bit, or between a subchannel corresponding to a third-type bit and a subchannel corresponding to a fourth-type bit. If the system design does not focus on cell handover performance, corresponding mapping processing is performed based on an originally classified bit type of the bits.

For another example, an HFI is repeatedly notified to a terminal in another manner in a low-frequency scenario. In this case, HFI information also has a characteristic of a first-type bit. For mapping to a subchannel of the polar code, the HFI information may be mapped to a position before a subchannel corresponding to a first-type bit or mapped to another unreliable position.

For another example, pilot density control signaling belongs to the fourth type of bits in a broadband application scenario, and belongs to the second type of bits in a narrowband scenario. The broadband application scenario is more frequently used, and has higher priorities of a load and the like in a system. Therefore, design requirements of a broadband system are satisfied preferentially, to map the one or more bits in a manner of mapping a fourth-type bit. On the contrary, if performance of a narrowband device is more considered, the one or more bits are mapped in a manner of mapping a second-type bit.
- (3) There is still a special case for such bits that carry different content in different scenarios: One or more bits carry one kind of content in a first scenario, but these bits do not carry content in a second scenario. In other words, in different scenarios, the bit may or may not carry content.

A manner of mapping the one or more bits is specifically as follows: For example, one or more bits used to indicate an SSBI in a high-frequency scenario do not carry information in a low-frequency scenario. In this case, the one or more bits may be processed in a manner of mapping a first-type bit, that is, the one or more bits are mapped to subchannels corresponding to first-type bits; or are mapped to positions of subchannels behind a subchannel corresponding to a first-type bit but before a position of a subchannel corresponding to a third-type bit.

For another example, some bandwidth configuration indication signaling belongs to the fourth type of bits and exists only in a high-frequency scenario. One or more bits used to carry such signaling do not carry information in a low-frequency scenario. If high-frequency performance is preferentially considered, the one or more bits may be processed in a manner of mapping a first-type bit, or the one or more bits are mapped to positions behind a subchannel corresponding to a first-type bit but before a position of a subchannel corresponding to a fourth-type bit.

On the whole, based on the foregoing classification of bit sets and an order from the first type to the fifth type, content of the payload of the PBCH is mapped to an information bit set of the polar code in ascending order of reliability of subchannels in the information bit set, or is mapped to an information bit set of the polar code according to natural sequence numbers, from front to back, of subchannels in the information bit set. Generally, this application is described based on reliability sorting. A specific mapping manner varies according to different classified types.

In addition, for the foregoing mapping manners, because the fifth type of bits is added, during subchannel selection for mapping of the five types of bits, a subchannel corresponding to a fifth-type bit needs to be considered. For example, mapping, based on the foregoing mapping manner, $M_5$ fifth-type bits to subchannels corresponding to $M_1$ first-type bits should be understood as: mapping the $M_5$ fifth-type bits to $M_5$ subchannels in subchannels corresponding to $(M_1+M_5)$ first-type bits. Other mapping manners are understood similarly.

Further, optionally, one or more bits that are classified as a specific type can still be further classified in that type. For example, based on an application scenario of the one or more bits, a bit classified as a fifth-type bit is further classified during mapping and correspondingly mapped. Such a design focuses on system compatibility and consistency, and characteristics of different scenarios are comprehensively considered with a minimum difference.

For example, the one or more bits that are classified as fifth-type bits and that are used to indicate an SSBI. The one or more bits belong to the third type of bits in a high-frequency scenario. In a low-frequency scenario, though their usage is to be determined, the one or more bits still belong to the third type of bits. For the foregoing high-frequency and low-frequency application scenarios, the one or more bits are further classified, and correspondingly mapped: If the one or more idle bits are not to be used in the future in a low-frequency scenario, the one or more bits are mapped to positions with relatively low reliability in subchannels corresponding to third-type bits; or if the one or more idle bits are designed for possible use in the future, the one or more bits are mapped to positions with relatively high reliability in subchannels corresponding to third-type bits.

In addition, an embodiment of this application further provides a distributed CRC (D-CRC) interleaving process shown in FIG. 7.

D-CRC itself needs interleaving once, and a mapping process further needs interleaving once. Therefore, an entire process needs to be implemented by combining two times of interleaving, so that a bit of a specific kind of content after the two times of interleaving is mapped to a channel with particular reliability. A specific flowchart is shown in FIG. 7.

$a_0, a_1, \ldots, a_k$ is broadcast information transferred from an upper layer, and turns into $b_0, b_1, \ldots, b_k$ after interleaving 1, d CRC bits are connected to the sequence to obtain a sequence $b_0, b_1, \ldots, b_k, c_0, c_1, \ldots, c_{d-1}$, and then distributed CRC (Distributed-CRC, D-CRC) interleaving is performed once to obtain $d_0, d_1, \ldots, d_{k+d-1}$.

The D-CRC interleaving is comprehensively considered. To achieve an eventual mapping effect in a table in FIG. 3b, an order of bits of various types of MIBs that need to be placed at specific reliable positions may be pre-mapped, so that bits that have undergone CRC connection and the D-CRC interleaving and that are mapped to subchannels in a polar code conform to the eventual mapping effect in the table in FIG. 3b. Similarly, one pre-interleaver may be used to perform pre-interleaving on MIB information for which a bit order is to be adjusted, so as to achieve a similar effect.

The following describes in detail mapping of polar subchannels of a polar code by using the foregoing mapping method when there is D-CRC.

Embodiment 1

A code length of a polar code is 512, and determining a payload of broadcast signaling includes: cyclic redundancy check CRC bits and predictable information bits. A quantity K of information bits is 56. For the cyclic redundancy check CRC bits, D-CRC is used as an example herein and D is 24 bits. A quantity M of predictable information bits is less than or equal to (56−24)=32.

First, in ascending order of reliability of subchannels, sequence numbers in a subchannel sequence number set corresponding to the information bits start from 0, totaling 56 bits. The specific set is as follows:

(441 469 247 367 253 375 444 470 483 415 485 473 474 254 379 431 489 486 476 439 490 463 381 497 492 443 382 498 445 471 500 446 475 487 504 255 477 491 478 383 493 499 502 494 501 447 505 506 479 508 495 503 507 509 510 511)

A D-CRC interleaver for K=56 and D=24 is as follows:
(0 2 3 5 7 10 11 12 14 15 18 19 21 24 26 30 31 32 1 4 6 8 13 16 20 22 25 27 33 9 17 23 28 34 29 35 36 37 38 39 40 41 42 43 44 45 46 47 48 49 50 51 52 53 54 55)

Based on the D-CRC interleaver, 24 subchannels are selected from subchannels corresponding to the foregoing information bits, to carry 24 D-CRC bits. The 24 specific D-CRC bits are mapped to 24 subchannels below:

(446 478 487 490 491 492 493 494 495 497 498 499 500 501 502 503 504 505 506 507 508 509 510 511).

Next, for sequence numbers of remaining polar subchannels, there are altogether 32 subchannels, used to carry the M predictable information bits, where M is less than or equal to 32:

(441 469 247 367 253 375 444 470 483 415 485 473 474 254 379 431 489 486 476 439 463 381 443 382 445 471 475 255 477 383 447 479).

A specific manner of mapping the M predictable information bits is as follows:

(1) When the M predictable information bits include fifth-type bits and third-type bits, where the fifth-type bits include an SSBI, the third-type bits include an HFI and an SFN, and fourth-type bits include an RMSI config and/or reserved bits to be used.

(a) Considering that the fifth-type bits SSBI are known bits on a low frequency band and are not to be used, the bits SSBI are classified as first-type bits on a low frequency band and are mapped to three lowest-reliability subchannels in the foregoing set of 32 subchannels, and the mapping is as follows:

SSBI: (247 441 469)

(b) The third-type bits HFI and SFN are mapped to three lowest-reliability subchannels in (32–3), namely, 29 subchannels. Specific mapping is as follows:

HFI: 367
SFN: (253 375 444 254 415 470 473 474 483 485)

Referring to the embodiment shown in FIG. 7, a bit sequence $d_0, d_1, \ldots, d_{k+d-1}$ is mapped to subchannels of the polar code in the foregoing mapping manner.

Further, optionally, reverse deduction is performed based on the foregoing mapping relationship of the polar subchannels and a D-CRC interleaving pattern, to obtain a corresponding output interleaved MIB sequence $b_0, b_1, \ldots, b_k$ after a MIB sequence $a_0, a_1, \ldots, a_k$ in FIG. 7 undergoes interleaving 1 and mapping. Details are as follows:

SSBI: (24 6 0)
HFI: 7
SFN: (2 10 30 8 17 18 23 16 20 3)

(2) Considering that the fifth-type bits SSBI will be used on a low frequency band in the future, the bits SSBI are classified as fourth-type bits. During mapping, mapping of the third-type bits is first considered. The third-type bits HFI and SFN are mapped to 11 lowest-reliability subchannels in the foregoing set of 32 subchannels (the HFI and the SFN are not further classified in this embodiment). Next, 21 remaining subchannels are considered, and three subchannels are selected from them to carry the SSBI. A specific subchannel mapping relationship is as follows:

HFI: (441)
SFN: (247 367 469 253 375 415 444 470 483 485)
SSBI: (254 473 474)

Further, optionally, reverse deduction is performed based on the foregoing mapping relationship of the polar subchannels and a D-CRC interleaving pattern, to obtain a corresponding output interleaved MIB sequence $b_0, b_1, \ldots, b_k$ after a MIB sequence $a_0, a_1, \ldots, a_k$ in FIG. 7 undergoes interleaving 1 and mapping. Details are as follows:

HFI: 24
SFN: (6 0 7 2 10 30 8 17 18 23)
SSBI: (16 20 3)

(3) When the M predictable information bits include second-type bits such as an RMSI config and third-type bits such as an HFI, an SFN, and an SSBI:

First, the second-type bits are considered. The second-type bits are mapped to eight lowest-reliability subchannels. Then, the third-type bits are considered. The third-type bits are mapped to 14 lowest-reliability subchannels in (32–8), namely, 24 subchannels.

Eventual subchannel mapping is as follows:
RMSI Config: (247 253 367 375 441 444 469 470)
HFI: 483
SFN: (415 473 485 254 379 431 474 476 486 489)
SSBI: (381 439 463)

Further, optionally, reverse deduction is performed based on the foregoing mapping relationship of the polar subchannels and a D-CRC interleaving pattern, to obtain a corresponding output interleaved MIB sequence $b_0, b_1, \ldots, b_k$ after a MIB sequence $a_0, a_1, \ldots, a_k$ in FIG. 7 undergoes interleaving 1 and mapping. Details are as follows:

RMSI Config: (24 6 0 7 2 10 30 8)
HFI: 17
SFN: (18 23 16 20 3 11 19 29 28 25)
SSBI: (21 4 12)

(4) When the M predictable information bits include first-type bits such as reserved bits not to be used and third-type bits such as an SSBI, an HFI, and an SFN:

First, the first-type bits are mapped to three lowest-reliability subchannels in the foregoing 32 subchannels. Then, the third-type bits are mapped to 14 lowest-reliability subchannels in (32–3), namely, 29 subchannels. Eventual subchannel mapping is as follows:

Reserved bits: (247 441 469)
SSBI: (253 367 375)
HFI: 444
SFN: (415 470 483 254 379 431 473 474 485 489)

Further, optionally, reverse deduction is performed based on the foregoing mapping relationship of the polar subchannels and a D-CRC interleaving pattern, to obtain a corresponding output interleaved MIB sequence $b_0, b_1, \ldots, b_k$ after a MIB sequence $a_0, a_1, \ldots, a_k$ in FIG. 7 undergoes interleaving 1 and mapping. Details are as follows: After reserved bits 24 6 0 undergo interleaving 1, the reserved bits are located at positions of an output interleaved MIB sequence. For example, the reserved bits are mapped to bit 24, bit 6, and bit 0 of the interleaved MIB sequence, that is, the reserved bits are placed at $b_0$, $b_6$, and $b_{24}$ in the MIB sequence:

SSBI: (7 2 10)
HFI: 30
SFN: (8 17 18 23 16 20 3 11 19 29)

Embodiment 2

A code length of a polar code polar code is 512, and determining a payload of broadcast signaling includes: cyclic redundancy check CRC bits and predictable information bits. The payload further includes the one or more bits at preset positions in subchannels of the polar code. A quantity K of information bits is 56. For the cyclic redundancy check CRC bits, D-CRC is used as an example herein and D is 24 bits. It is assumed that a quantity of the bits at the preset positions in the subchannels of the polar code is X. A quantity M of predictable information bits is less than or equal to (56–24–X). First, in ascending order of reliability of subchannels, sequence numbers in a subchannel sequence number set corresponding to the information bits start from 0, totaling 56 bits. The specific set is as follows:

(441 469 247 367 253 375 444 470 483 415 485 473 474 254 379 431 489 486 476 439 490 463 381 497 492 443 382 498 445 471 500 446 475 487 504 255 477 491 478 383 493 499 502 494 501 447 505 506 479 508 495 503 507 509 510 511)

A D-CRC interleaver for K=56 and D=24 is as follows:
(0 2 3 5 7 10 11 12 14 15 18 19 21 24 26 30 31 32 1 4 6 8 13 16 20 22 25 27 33 9 17 23 34 29 35 36 37 38 39 40 41 42 43 44 45 46 47 48 49 50 51 52 53 54 55)

Based on the D-CRC interleaver, 24 subchannels are selected from subchannels corresponding to the foregoing information bits, to carry 24 D-CRC bits. The 24 specific D-CRC bits are mapped to 24 subchannels below:
(446 478 487 490 491 492 493 494 495 497 498 499 500 501 502 503 504 505 506 507 508 509 510 511)

Next, X subchannels are selected from remaining polar subchannel sequence numbers, totaling 32 subchannels, to carry the bits at the preset positions in the subchannels of the polar code. For example:

(1) Three bits of an SSBI are used to carry the bits at the preset positions in the subchannels of the polar code. In this case, the three bits of the SSBI are placed at front positions, namely, (247 253 254), in a natural sequence of subchannels of the information bits of the polar code. Remaining (32−3), namely, 29 subchannels are mapped to the M predictable information bits in manners of mapping the first type of bits to the fourth type of bits. Eventual subchannel mapping is as follows:
SSBI: (247 253 254)
HFI: 441
SFN: (367 375 469 415 444 470 473 474 483 485)

Further, optionally, reverse deduction is performed based on the foregoing mapping relationship of the polar subchannels and a D-CRC interleaving pattern, to obtain a corresponding output interleaved MIB sequence $b_0, b_1, \ldots, b_k$ after a MIB sequence $a_0, a_1, \ldots, a_k$ in FIG. 7 undergoes interleaving 1 and mapping. Details are as follows:
SSBI: (0 2 3)
HFI: 24
SFN: (6 7 10 30 8 17 18 23 16 20)

(2) One bit of a "Cell barred flag" and three bits of an SSBI are used to carry the bits at the preset positions in the subchannels of the polar code. In this case, the bit of the "Cell barred flag" and the three bits of the SSBI are placed at front positions, namely, (247 253 254 255), in a natural sequence of subchannels of the information bits of the polar code. For a manner of mapping remaining subchannels that carry the M predictable information bits, mapping is performed in manners of mapping the first type of bits to the fourth type of bits.
Eventual subchannel mapping is as follows:
Cell barred: 247
SSBI: (253 254 255)
HFI: 441
SFN: (367 375 469 415 444 470 473 474 483 485)

Further, optionally, reverse deduction is performed based on the foregoing mapping relationship of the polar subchannels and a D-CRC interleaving pattern, to obtain a corresponding output interleaved MIB sequence $b_0, b_1, \ldots, b_k$ after a MIB sequence $a_0, a_1, \ldots, a_k$ in FIG. 7 undergoes interleaving 1 and mapping. Details are as follows:
Cell barred: 0
SSBI: (2 3 5)
HFI: 24
SFN: (6 7 10 30 8 17 18 23 16 20)

(3) One bit of a "Cell barred flag" and three bits of an SSBI are used to carry the bits at the preset positions in the subchannels of the polar code. In this case, the three bits of the SSBI are placed at front positions, namely, (247 253 254), in a natural sequence of subchannels of the information bits of the polar code. The "Cell barred flag" is placed at a relatively front position. Because a value of the "Cell barred flag" may vary, placing the "Cell barred flag" at a position with relatively high reliability is conducive to overall performance. For example, the "Cell barred flag" is placed at a position 255. For a manner of mapping remaining subchannels that carry the M predictable information bits, mapping is performed in manners of mapping the first type of bits to the fourth type of bits. Details are not described again.

In the foregoing Embodiment 1 and Embodiment 2, detailed descriptions are made by using an example in which the quantity K of information bits is 56. The following further makes a detailed description by using an example in which the quantity K of information bits is 64.

Embodiment 3

A code length of a polar code polar code is 512, and determining a payload payload of broadcast signaling includes: cyclic redundancy check CRC bits and predictable information bits. A quantity K of information bits is 64. For the cyclic redundancy check CRC bits, D-CRC is used as an example herein and D is 24 bits. A quantity M of predictable information bits is less than or equal to (64−24)=40.

First, in ascending order of reliability of subchannels, sequence numbers in a subchannel sequence number set corresponding to the information bits start from 0, totaling 64 bits. The specific set is as follows:
461 496 351 467 438 251 462 442 441 469 247 367 253 375 444 470 483 415 485 473 474 254 379 431 489 486 476 439 490 463 381 497 492 443 382 498 445 471 500 446 475 487 504 255 477 491 478 383 493 499 502 494 501 447 505 506 479 508 495 503 507 509 510 511

A D-CRC interleaver for K=64 and D=24 is as follows:
(1 4 6 8 10 11 13 15 18 19 20 22 23 26 27 29 32 34 38 39 40 2 5 7 9 12 14 16 21 24 28 30 33 35 41 0 3 17 25 31 36 42 37 43 44 45 46 47 48 49 50 51 52 53 54 55 56 57 58 59 60 61 62 63)

Based on the D-CRC interleaver, 24 subchannels are selected from subchannels corresponding to the foregoing information bits, to carry 24 D-CRC bits. The 24 specific D-CRC bits are mapped to 24 subchannels below:
445 477 489 491 492 493 494 495 496 497 498 499 500 501 502 503 504 505 506 507 508 509 510 511

Next, for remaining polar subchannel sequence numbers, there are altogether 40 subchannels, used to carry the M predictable information bits, where M is less than or equal to 40:
461 351 467 438 251 462 442 441 469 247 367 253 375 444 470 483 415 485 473 474 254 379 431 486 476 439 490 463 381 443 382 471 446 475 487 255 478 383 447 479

(1) When the M predictable information bits include fifth-type bits and third-type bits, where the fifth-type bits include an SSBI, the third-type bits include an HFI and an SFN, and fourth-type bits include an RMSI config and/or reserved bits to be used:

(a) Considering that the fifth-type bits SSBI are known bits on a low frequency band and are not to be used, the bits SSBI are classified as first-type bits on a low frequency band and are mapped to three lowest-reliability subchannels in the foregoing set of 40 subchannels, and the mapping is as follows:

SSBI: (351 461 467)
  (b) The third-type bits HFI and SFN are mapped to three lowest-reliability subchannels in (40−3), namely, 37 subchannels. Specific mapping is as follows:
  HFI: 438
  SFN: (251 442 462 247 253 367 375 441 444 469)
  Referring to the embodiment shown in FIG. 7, a bit sequence $d_0, d_1, \ldots, d_{k+d-1}$ is mapped to subchannels of the polar code in the foregoing mapping manner.
  Further, optionally, reverse deduction is performed based on the foregoing mapping relationship of the polar subchannels and a D-CRC interleaving pattern, to obtain a corresponding output interleaved MIB sequence $b_0, b_1, \ldots, b_k$ after a MIB sequence $a_0, a_1, \ldots, a_k$ in FIG. 7 undergoes interleaving 1 and mapping. Details are as follows:
  SSBI: (7 11 14)
  HFI: 27
  SFN: (4 9 34 32 16 1 13 6 15 39)
  (2) Considering that the fifth-type bits SSBI will be used on a low frequency band in the future, the bits SSBI are classified as fourth-type bits. During mapping, mapping of the third-type bits is first considered. The third-type bits HFI and SFN are mapped to 11 lowest-reliability subchannels in the foregoing set of 32 subchannels (the HFI and the SFN are not further classified in this embodiment). Next, remaining subchannels are considered, and three subchannels are selected from them to carry the SSBI. A specific subchannel mapping relationship is as follows:
  HFI: 461
  SFN: (351 438 467 247 251 367 441 442 462 469)
  SSBI: (253 375 444)
  Further, optionally, reverse deduction is performed based on the foregoing mapping relationship of the polar subchannels and a D-CRC interleaving pattern, to obtain a corresponding output interleaved MIB sequence $b_0, b_1, \ldots, b_k$ after a MIB sequence $a_0, a_1, \ldots, a_k$ in FIG. 7 undergoes interleaving 1 and mapping. Details are as follows:
  HFI: 7
  SFN: (11 14 27 4 9 34 32 16 1 13)
  SSBI: (6 15 39)
  (3) When the M predictable information bits include second-type bits such as an RMSI config and third-type bits such as an HFI, an SFN, and an SSBI:
  The second-type bits are considered first. The second-type bits are mapped to eight lowest-reliability subchannels. Then, the third-type bits are considered. The third-type bits are mapped to 14 lowest-reliability subchannels in remaining subchannels.
    RMSI config: at a front position (where the RMSI config belongs to the second type):
    RMSI config, HFI, SFN, SSBI, . . .
    Eventual subchannel mapping is as follows:
    RMSI Config: (251 351 438 441 442 461 462 467)
    HFI: 469
    SFN: (247 253 367 375 415 444 470 473 483 485)
    SSBI: (254 379 474)
  Further, optionally, reverse deduction is performed based on the foregoing mapping relationship of the polar subchannels and a D-CRC interleaving pattern, to obtain a corresponding output interleaved MIB sequence $b_0, b_1, \ldots, b_k$ after a MIB sequence $a_0, a_1, \ldots, a_k$ in FIG. 7 undergoes interleaving 1 and mapping. Details are as follows:
  RMSI Config: (7 11 14 27 4 9 34 32)
  HFI: 16
  SFN1: (1 13 6 15 39 21 17 23 25 28)
  SSBI: (30 8 18)
  (4) When the M predictable information bits include first-type bits such as reserved bits not to be used and third-type bits such as an SSBI, an HFI, and an SFN:
  First, the first-type bits are mapped to three lowest-reliability subchannels in the foregoing 40 subchannels. Then, the third-type bits are mapped to 14 lowest-reliability subchannels in remaining subchannels. Eventual subchannel mapping is as follows:
  Eventual subchannel mapping is as follows:
  Reserved bits: (351 461 467)
  SSBI: (251 438 462)
  HFI: 442
  SFN: (247 441 469 253 367 375 415 444 470 483)
  Further, optionally, reverse deduction is performed based on the foregoing mapping relationship of the polar subchannels and a D-CRC interleaving pattern, to obtain a corresponding output interleaved MIB sequence $b_0, b_1, \ldots, b_k$ after a MIB sequence $a_0, a_1, \ldots, a_k$ in FIG. 7 undergoes interleaving 1 and mapping. Details are as follows:
  Reserved bits: (7 11 14)
  SSBI: (27 4 9)
  HFI: 34
  SFN: (32 16 1 13 6 15 39 21 17 23)

Embodiment 4

A code length of a polar code polar code is 512, and determining a payload payload of broadcast signaling includes: cyclic redundancy check CRC bits, predictable information bits, and bits at preset positions in subchannels of the polar code. A quantity K of information bits is 64. For the cyclic redundancy check CRC bits, D-CRC is used as an example herein and D is 24 bits. It is assumed that a quantity of the bits at the preset positions in the subchannels of the polar code is X. A quantity M of predictable information bits is less than or equal to (64−24−X).

First, in ascending order of reliability of subchannels, sequence numbers in a subchannel sequence number set corresponding to the information bits start from 0, totaling 64 bits. The specific set is as follows:
  (441 469 247 367 253 375 444 470 483 415 485 473 474 254 379 431 489 486 476 439 490 463 381 497 492 443 382 498 445 471 500 446 475 487 504 255 477 491 478 383 493 499 502 494 501 447 505 506 479 508 495 503 507 509 510 511)
A D-CRC interleaver for K=64 and D=24 is as follows:
  (1 4 6 8 10 11 13 15 18 19 20 22 23 26 27 29 32 34 38 39 40 2 5 7 9 12 14 16 21 24 28 30 33 35 41 0 3 17 25 31 36 42 37 43 44 45 46 47 48 49 50 51 52 53 54 55 56 57 58 59 60 61 62 63)
Based on the D-CRC interleaver, 24 subchannels are selected from subchannels corresponding to the foregoing information bits, to carry 24 D-CRC bits. The 24 specific D-CRC bits are mapped to 24 subchannels below:
  (446 478 487 490 491 492 493 494 495 497 498 499 500 501 502 503 504 505 506 507 508 509 510 511)
Next, X subchannels are selected from remaining polar subchannel sequence numbers, totaling 40 subchannels, to carry the bits at the preset positions in the subchannels of the polar code. For example:
  (1) Three bits of an SSBI are used to carry the bits at the preset positions in the subchannels of the polar code. In this case, the three bits of the SSBI are placed at front positions, namely, (247 251 253), in a natural sequence of subchannels of the information bits of the polar code. Remaining subchannels are mapped to the M predictable information bits in manners of mapping the first type of bits to the fourth type of bits.

Eventual subchannel mapping is as follows:

SSBI: (247 251 253)

HFI: 461

SFN: (351 438 467 367 375 441 442 444 462 469)

Further, optionally, reverse deduction is performed based on the foregoing mapping relationship of the polar subchannels and a D-CRC interleaving pattern, to obtain a corresponding output interleaved MIB sequence $b_0, b_1, \ldots, b_k$ after a MIB sequence $a_0, a_1, \ldots, a_k$ in FIG. 7 undergoes interleaving 1 and mapping. Details are as follows:

SSBI: (146)

HFI: 7

SFN: (11 14 27 9 34 32 16 13 15 39)

(2) One bit of a "Cell barred flag" and three bits of an SSBI are used to carry the bits at the preset positions in the subchannels of the polar code. In this case, the bit of the "Cell barred flag" and the three bits of the SSBI are placed at front positions, namely, (247 253 254 255), in a natural sequence of subchannels of the information bits of the polar code. For a manner of mapping remaining subchannels that carry the M predictable information bits, mapping is performed in manners of mapping the first type of bits to the fourth type of bits. Eventual subchannel mapping is as follows:

Cell barred: 247

SSBI: (251 253 254)

HFI: 461

SFN: (351 438 467 367 375 441 442 444 462 469)

Further, optionally, reverse deduction is performed based on the foregoing mapping relationship of the polar subchannels and a D-CRC interleaving pattern, to obtain a corresponding output interleaved MIB sequence $b_0, b_1, \ldots, b_k$ after a MIB sequence $a_0, a_1, \ldots, a_k$ in FIG. 7 undergoes interleaving 1 and mapping. Details are as follows:

Cell barred: 1

SSBI: (46 8)

HFI: 7

SFN1: (11 14 27 9 34 32 16 13 15 39)

(3) One bit of a "Cell barred flag" and three bits of an SSBI are used to carry the bits at the preset positions in the subchannels of the polar code. In this case, the three bits of the SSBI are placed at front positions, namely, (247 251 253), in a natural sequence of subchannels of the information bits of the polar code. The "Cell barred flag" is placed at a relatively front position. Because a value of the "Cell barred flag" may vary, placing the "Cell barred flag" at a position with relatively high reliability is conducive to overall performance. For example, the "Cell barred flag" is placed at a position 255. For a manner of mapping remaining subchannels that carry the M predictable information bits, mapping is performed in manners of mapping the first type of bits to the fourth type of bits. Details are not described again.

What is claimed is:

1. A method comprising:
receiving, by a wireless communications receiving apparatus, polar encoded data;
decoding, by the wireless communications receiving apparatus, the polar encoded data to obtain a physical broadcast channel, PBCH, payload based on a distributed cyclic redundancy check, D-CRC, pattern;
wherein the PBCH payload comprises a synchronization signal block index, SSBI, a size of the PBCH payload is 32, a number of CRC bits are 24, the D-CRC pattern is (0, 2, 3, 5, 7, 10, 11, 12, 14, 15, 18, 19, 21, 24, 26, 30, 31, 32, 1, 4, 6, 8, 13, 16, 20, 22, 25, 27, 33, 9, 17, 23, 28, 34, 29, 35, 36, 37, 38, 39, 40, 41, 42, 43, 44, 45, 46, 47, 48, 49, 50, 51, 52, 53, 54, 55), the bits in the PBCH payload corresponding to the set {2, 3, 5} in the D-CRC pattern are the SSBI.

2. The method according to claim 1, wherein a code length of a polar code corresponding to the PBCH payload is 512.

3. The method according to claim 2, wherein for a polar code with sequence numbers sorted in ascending order of reliability, the sequence numbers corresponding to PBCH payloads and the CRC bits are as follows:
(441, 469, 247, 367, 253, 375, 444, 470, 483, 415, 485, 473, 474, 254, 379, 431, 489, 486, 476, 439, 490, 463, 381, 497, 492, 443, 382, 498, 445, 471, 500, 446, 475, 487, 504, 255, 477, 491, 478, 383, 493, 499, 502, 494, 501, 447, 505, 506, 479, 508, 495, 503, 507, 509, 510, 511).

4. The method according to claim 3, wherein subchannel sequence numbers carrying the CRC bits are:
(446,478,487,490,491,492,493,494,495,497,498,499, 500,501,502,503,504,505,506,507,508, 509, 510, 511).

5. The method according to claim 1, wherein bits for indicating timing further comprises a set of bits for indicating system frame number (SFN), part of the set of bits for indicating the SFN are placed in positions indicated by sequence numbers of 6, 10, 30, 8, 17, 18, and 23 in the first interleaved sequence.

6. The method according to claim 1, wherein the wireless communications receiving apparatus is an access terminal.

7. A data processing apparatus in a wireless communication network, comprising:
a memory storing instructions;
at least one processor coupled to the memory for executing the instructions to perform operations comprising:
receiving polar encoded data;
decoding the polar encoded data to obtain a physical broadcast channel, PBCH, payload based on a distributed cyclic redundancy check, D-CRC, pattern;
wherein the PBCH payload comprises a synchronization signal block index, SSBI, a size of the PBCH payload is 32, a number of CRC bits are 24, the D-CRC pattern is (0, 2, 3, 5, 7, 10, 11, 12, 14, 15, 18, 19, 21, 24, 26, 30, 31, 32, 1, 4, 6, 8, 13, 16, 20, 22, 25, 27, 33, 9, 17, 23, 28, 34, 29, 35, 36, 37, 38, 39, 40, 41, 42, 43, 44, 45, 46, 47, 48, 49, 50, 51, 52, 53, 54, 55), the bits in the PBCH payload corresponding to the set {2, 3, 5} in the D-CRC pattern are the SSBI.

8. The data processing apparatus according to claim 7, wherein a code length of a polar code corresponding to the PBCH payload is 512.

9. The data processing apparatus according to claim 8, wherein for a polar code with sequence numbers sorted in ascending order of reliability, the sequence numbers corresponding to PBCH payloads and the CRC bits are as follows:
(441, 469, 247, 367, 253, 375, 444, 470, 483, 415, 485, 473, 474, 254, 379, 431, 489, 486, 476, 439, 490, 463, 381, 497, 492, 443, 382, 498, 445, 471, 500, 446, 475, 487, 504, 255, 477, 491, 478, 383, 493, 499, 502, 494, 501, 447, 505, 506, 479, 508, 495, 503, 507, 509, 510, 511).

10. The data processing apparatus according to claim 9, wherein subchannel sequence numbers carrying the CRC bits are:

(446,478,487,490,491,492,493,494,495,497,498,499, 500,501,502,503,504,505,506,507,508, 509, 510, 511).

11. The data processing apparatus according to claim 7, wherein bits for indicating timing further comprises a set of bits for indicating system frame number (SFN), part of the set of bits for indicating the SFN are placed in positions indicated by sequence numbers of 6, 10, 30, 8, 17, 18, and 23 in the first interleaved sequence.

12. The data processing apparatus according to claim 7, wherein the apparatus is an access terminal.

13. A non-transitory computer readable medium comprising instructions which, when executed by a computer, cause the computer to perform:
receiving polar encoded data;
decoding the polar encoded data to obtain a physical broadcast channel, PBCH, payload based on a distributed cyclic redundancy check, D-CRC, pattern;
wherein the PBCH payload comprises a synchronization signal block index, SSBI, a size of the PBCH payload is 32, a number of CRC bits are 24, the D-CRC pattern is (0, 2, 3, 5, 7, 10, 11, 12, 14, 15, 18, 19, 21, 24, 26, 30, 31, 32, 1, 4, 6, 8, 13, 16, 20, 22, 25, 27, 33, 9, 17, 23, 28, 34, 29, 35, 36, 37, 38, 39, 40, 41, 42, 43, 44, 45, 46, 47, 48, 49, 50, 51, 52, 53, 54, 55), the bits in the PBCH payload corresponding to the set {2, 3, 5} in the D-CRC pattern are the SSBI.

14. The computer readable medium according to claim 13, wherein a code length of a polar code corresponding to the PBCH payload is 512.

15. The computer readable medium according to claim 14, wherein for a polar code with sequence numbers sorted in ascending order of reliability, the sequence numbers corresponding to PBCH payloads and the CRC bits are as follows:
(441, 469, 247, 367, 253, 375, 444, 470, 483, 415, 485, 473, 474, 254, 379, 431, 489, 486, 476, 439, 490, 463, 381, 497, 492, 443, 382, 498, 445, 471, 500, 446, 475, 487, 504, 255, 477, 491, 478, 383, 493, 499, 502, 494, 501, 447, 505, 506, 479, 508, 495, 503, 507, 509, 510, 511).

16. The computer readable medium according to claim 15, wherein subchannel sequence numbers carrying the CRC bits are:
(446,478,487,490,491,492,493,494,495,497,498,499, 500,501,502,503,504,505,506,507,508, 509, 510, 511).

17. The computer readable medium according to claim 13, wherein bits for indicating timing further comprises a set of bits for indicating system frame number (SFN), part of the set of bits for indicating the SFN are placed in positions indicated by sequence numbers of 6, 10, 30, 8, 17, 18, and 23 in the first interleaved sequence.

\* \* \* \* \*

UNITED STATES PATENT AND TRADEMARK OFFICE
CERTIFICATE OF CORRECTION

PATENT NO. : 12,267,162 B2
APPLICATION NO. : 18/512912
DATED : April 1, 2025
INVENTOR(S) : Hejia Luo et al.

Page 1 of 1

It is certified that error appears in the above-identified patent and that said Letters Patent is hereby corrected as shown below:

In the Claims

In Column 34, In Line 23-24, In Claim 4, delete "(446,478,487,490,491,492,493,494,495,497,498,499,500,501,502,503,504,505,506,507,508," and insert -- (446, 478, 487, 490, 491, 492, 493, 494, 495, 497, 498, 499, 500, 501, 502, 503, 504, 505, 506, 507, 508, --.

In Column 35, In Line 1-2, In Claim 10, delete "(446,478,487,490,491,492,493,494,495,497,498,499,500,501,502,503,504,505,506,507,508," and insert -- (446, 478, 487, 490, 491, 492, 493, 494, 495, 497, 498, 499, 500, 501, 502, 503, 504, 505, 506, 507, 508, --.

In Column 36, In Line 18-19, In Claim 16, delete "(446,478,487,490,491,492,493,494,495,497,498,499,500,501,502,503,504,505,506,507,508," and insert -- (446, 478, 487, 490, 491, 492, 493, 494, 495, 497, 498, 499, 500, 501, 502, 503, 504, 505, 506, 507, 508, --.

Signed and Sealed this
Twenty-second Day of July, 2025

Coke Morgan Stewart
*Acting Director of the United States Patent and Trademark Office*